United States Patent
Endoh et al.

(10) Patent No.: US 8,124,539 B2
(45) Date of Patent: Feb. 28, 2012

(54) PLASMA PROCESSING APPARATUS, FOCUS RING, AND SUSCEPTOR

(75) Inventors: Shosuke Endoh, Nirasaki (JP); Noriyuki Iwabuchi, Miyagi-gun (JP); Shigeaki Kato, Nirasaki (JP); Tomoya Okubo, Nirasaki (JP); Jun Hirose, Nirasaki (JP); Koichi Nagakura, Nirasaki (JP); Chishio Koshimizu, Nirasaki (JP); Kazuki Denpoh, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/850,391

(22) Filed: Aug. 4, 2010

(65) Prior Publication Data
US 2011/0000883 A1    Jan. 6, 2011

Related U.S. Application Data

(63) Continuation of application No. 10/828,437, filed on Apr. 21, 2004, now abandoned.

(30) Foreign Application Priority Data

| Apr. 24, 2003 | (JP) | 2003-120419 |
| Jul. 8, 2003 | (JP) | 2003-271975 |
| Jul. 31, 2003 | (JP) | 2003-204898 |
| Apr. 9, 2004 | (JP) | 2004-115807 |

(51) Int. Cl.
*H01L 21/302* (2006.01)
(52) U.S. Cl. ........ 438/714; 438/706; 438/729; 216/71
(58) Field of Classification Search ............... 438/706, 438/710, 712, 714, 729; 156/345.3, 53, 37; 216/67, 71
See application file for complete search history.

(56) References Cited

U.S. PATENT DOCUMENTS

| 4,960,488 A | 10/1990 | Law et al. |
| 5,491,603 A | 2/1996 | Birang et al. |
| 5,520,742 A | 5/1996 | Ohkase |
| 5,534,072 A | 7/1996 | Mizuno et al. |
| 5,556,500 A | 9/1996 | Hasegawa et al. |
| 5,622,593 A | 4/1997 | Arasawa et al. |
| 5,849,092 A | 12/1998 | Xi et al. |
| 5,856,240 A | 1/1999 | Sinha et al. |
| 5,958,265 A * | 9/1999 | Ogahara .......... 219/121.43 |

(Continued)

FOREIGN PATENT DOCUMENTS

JP    H04-279044    10/1992

(Continued)

OTHER PUBLICATIONS

JP 07321184_Eng dated Dec. 8, 1995.

*Primary Examiner* — Lan Vinh
(74) *Attorney, Agent, or Firm* — Oblon, Spivak, McClelland, Maier & Neustadt, L.L.P.

(57) ABSTRACT

A plasma processing apparatus having a focus ring, enables the efficiency of cooling of the focus ring to be greatly improved, while preventing an increase in cost thereof. The plasma processing apparatus is comprised of a susceptor which has an electrostatic chuck and the focus ring. A wafer W to be subjected to plasma processing is mounted on the electrostatic chuck. The focus ring has a dielectric material portion and a conductive material portion. The dielectric material portion forms a contact portion disposed in contact with the electrostatic chuck. The conductive material portion faces the electrostatic chuck with the dielectric material portion therebetween.

14 Claims, 18 Drawing Sheets

U.S. PATENT DOCUMENTS

| | | | |
|---|---|---|---|
| RE36,810 E | 8/2000 | Arasawa et al. | |
| 6,125,025 A | 9/2000 | Howald et al. | |
| 6,323,133 B1 | 11/2001 | Donohoe et al. | |
| 6,373,681 B2* | 4/2002 | Kanno et al. | 361/234 |
| 6,391,789 B2 | 5/2002 | Sango | |
| 6,466,426 B1 | 10/2002 | Mok et al. | |
| 6,506,686 B2 | 1/2003 | Masuda et al. | |
| 6,528,427 B2 | 3/2003 | Chebi et al. | |
| 6,676,804 B1* | 1/2004 | Koshimizu et al. | 156/345.53 |
| 6,723,202 B2 | 4/2004 | Nagaiwa et al. | |
| 6,759,336 B1 | 7/2004 | Chebi et al. | |
| 6,767,844 B2* | 7/2004 | Huang | 438/758 |
| 6,844,273 B2 | 1/2005 | Kato et al. | |
| 2001/0008172 A1 | 7/2001 | Shoda et al. | |
| 2001/0022293 A1 | 9/2001 | Maeda et al. | |
| 2002/0005252 A1* | 1/2002 | Masuda et al. | 156/345 |
| 2002/0029745 A1 | 3/2002 | Nagaiwa et al. | |
| 2002/0037652 A1 | 3/2002 | Moriya et al. | |
| 2002/0139388 A1 | 10/2002 | Chebi et al. | |
| 2003/0106647 A1 | 6/2003 | Koshiishi et al. | |
| 2003/0155075 A1* | 8/2003 | Yasui et al. | 156/345.28 |
| 2003/0164226 A1 | 9/2003 | Kanno et al. | |
| 2004/0005726 A1 | 1/2004 | Huang | |
| 2004/0081439 A1 | 4/2004 | Kholodenko et al. | |
| 2004/0099635 A1 | 5/2004 | Nishikawa | |
| 2005/0139578 A1 | 6/2005 | Fukuda et al. | |

FOREIGN PATENT DOCUMENTS

| | | |
|---|---|---|
| JP | 07-074231 | 3/1995 |
| JP | H7-135200 | 5/1995 |
| JP | 07-211681 | 8/1995 |
| JP | 07-321184 | 12/1995 |
| JP | H8-102461 | 4/1996 |
| JP | 09-082781 | 3/1997 |
| JP | 09-232290 | 9/1997 |
| JP | 11-330047 | 11/1999 |
| JP | 11-340149 | 12/1999 |
| JP | 2001-230239 | 8/2001 |
| JP | 2001-250815 | 9/2001 |
| JP | 2002-009048 | 1/2002 |
| JP | 2002-16126 | 1/2002 |
| JP | 2002-033376 | 1/2002 |
| JP | 2003-519907 | 6/2003 |
| KR | 2001-0098814 | 11/2001 |
| WO | WO 02/065532 | 8/2002 |

* cited by examiner

| FIG. 8A | FIG. 8B |

PLASMA PROCESSING APPARATUS, FOCUS RING, AND SUSCEPTOR

CROSS-REFERENCE TO RELATED APPLICATIONS

This application is a continuation of U.S. application Ser. No. 10/828,437, filed Apr. 21, 2004 now abandoned, which claims priority under 35 U.S.C. 119 to Japanese Patent Application Nos. 2003-120419 filed Apr. 24, 2003, 2003-271975, filed Jul. 8, 2003, 2003-204898, filed Jul. 31, 2003, and 2004-115807, filed Apr. 9, 2004, the entire contents of which is incorporated herein by reference.

BACKGROUND OF THE INVENTION

1. Field of the Invention

The present invention relates to a plasma processing apparatus, a focus ring, and a susceptor.

2. Description of the Related Art

Widely known examples of plasma processing apparatuses include CVD apparatuses, etching apparatuses, ashing apparatuses and so on. Such a plasma processing apparatus has a plasma processing chamber in which is installed a susceptor on which a wafer W, i.e. an object to be processed, is mounted. As shown in FIG. 16, the susceptor is comprised of a disk-shaped electrostatic chuck 51 on which the wafer W is mounted, and a focus ring 52 that is made of only a conductive material or only a dielectric material and is disposed on an outer peripheral edge of an upper surface of the electrostatic chuck 51.

When carrying out plasma processing on a wafer W, the wafer W is mounted on the electrostatic chuck 51, and then while maintaining the processing chamber at a predetermined degree of vacuum, in a state with the processing chamber filled with a processing gas, for example a processing gas comprised of $C_4F_8$, $O_2$ and Ar, the wafer W is fixed onto the electrostatic chuck 51 using electrostatic attraction, and high-frequency electrical power is applied to the electrostatic chuck 51, thus producing a plasma from the processing gas in the processing chamber. The plasma is focused over the wafer W by the focus ring 52 on the electrostatic chuck 51, and hence predetermined plasma processing (e.g. dry etching (reactive ion etching: RIE) processing) is carried out on the wafer W. At this time, the temperature of the wafer W increases due to being subjected to the dry etching processing, but the wafer W is cooled by a cooling mechanism built into the electrostatic chuck 51. In this cooling, a backside gas such as helium gas having excellent heat transfer ability is made to flow from the upper surface of the electrostatic chuck 51 toward the rear surface of the wafer W, thus improving the heat transfer ability between the electrostatic chuck 51 and the wafer W, whereby the wafer W is cooled efficiently.

On the other hand, a gap of which a width is several microns exists between the upper surface of the outer peripheral edge of the electrostatic chuck 51 and a rear surface of the focus ring 52 due to undulations on the rear surface of the focus ring 52 caused by surface roughness thereof. When the processing chamber is put into a vacuum state by reducing the pressure therein, this gap becomes in a vacuum state, and thus forms a vacuum thermal insulation layer; the heat transfer ability between the electrostatic chuck 51 and the focus ring 52 thus becomes low, and hence the focus ring 52 cannot be cooled efficiently as with the wafer W, and as a result the temperature of the focus ring 52 rises more than the temperature of the wafer W. Due to this increase in the temperature of the focus ring 52, an outer peripheral portion of the wafer W becomes hotter than an inside portion thereof, and hence at the outer peripheral portion the etching characteristics become poor, i.e. the hole penetration property (the perpendicular degree of a hole formed by etching relative to a surface of the wafer W) deteriorates, the etching selectivity drops and so on.

Moreover, in recent years, there have been rapid advances in increasing the diameter of wafers W and in ultrafine processing, and hence it has become that a large number of devices are produced from a single wafer W. There are thus cases in which devices are also produced from the outer peripheral portion of a wafer W. It is thus necessary to prevent the temperature of the focus ring 52 from increasing, thus preventing the etching characteristics at the outer peripheral portion of the wafer W from deteriorating.

To prevent the temperature of the focus ring 52 from increasing, it is necessary to improve the heat transfer ability between the focus ring and the electrostatic chuck; as a susceptor in which this heat transfer ability is improved, as shown in FIG. 17, there is known a susceptor 66 comprised of an electrostatic chuck 62 having coolant channels 61 built therein, a focus ring 63 disposed on an outer peripheral edge of a wafer W mounting surface of the electrostatic chuck 62, a heat transfer medium 64 interposed between the electrostatic chuck 62 and the focus ring 63, and a fixing jig 65 that presses and thus fixes the focus ring 63 against the electrostatic chuck 62 (see Japanese Laid-open Patent Publication (Kokai) No. 2002-16126 (FIG. 1)).

According to the susceptor 66, the heat transfer medium 64 is deformed by a load applied thereto from the fixing jig 65 via the focus ring 63, and thus fills the gap between the electrostatic chuck 62 and the focus ring 63, and hence the degree of close contact between the electrostatic chuck 62 and the focus ring 63 is increased, whereby the heat transfer ability between the electrostatic chuck 62 and the focus ring 63 is improved.

Moreover, as an etching apparatus in which the temperature of the focus ring is prevented from increasing, as shown in FIG. 18, there is known an etching apparatus 75 comprised of an electrostatic chuck 72 provided inside a reaction chamber 71, a focus ring 73 provided at a periphery of an upper portion of the electrostatic chuck 72, and cooling means (a cooling unit) 74 provided along a lower surface of the focus ring 73, wherein the cooling unit 74 has a substrate 74a that is made of a material having good thermal conductivity and is provided in close contact with the lower surface of the focus ring 73, and a coolant pipe 74b that is provided inside the substrate 74a and through which a coolant is circulated (see Japanese Laid-open Patent Publication (Kokai) No. H11-330047 (FIG. 1)).

Moreover, as another etching apparatus, there is known an apparatus in which a backside gas such as helium (He) gas having excellent heat transfer ability is made to flow from an upper surface of an electrostatic chuck toward a rear surface of a focus ring, thus diffusing the backside gas through a vacuum gap existing between the electrostatic chuck and the focus ring and hence filling this vacuum gap with the backside gas, whereby the heat transfer ability between the electrostatic chuck and the focus ring is improved.

Furthermore, to improve the heat transfer ability between a focus ring and an electrostatic chuck, the degree of close contact between the focus ring and the electrostatic chuck may be improved. To this purpose, there is known an etching apparatus having an electrode built into the electrostatic chuck in a manner facing the focus ring. According to this apparatus, a voltage is applied to the electrode, whereby the electrode attracts the focus ring to the electrostatic chuck by electrostatic attraction, thus improving the degree of close contact between the focus ring and the electrostatic chuck.

However, with the susceptor 66 described above, in addition to the component parts of a conventional susceptor, the heat transfer medium 64 and the fixing jig 65 are necessary, and hence the initial cost increases. Furthermore, the fixing jig 65 is exposed to the plasma, and hence is consumed as plasma processing is carried out repeatedly, resulting in regular maintenance becoming necessary. There is thus also a problem of the maintenance cost increasing.

Moreover, the coolant channels 61 built into the electrostatic chuck 62 collect not only heat from the focus ring 63 but also heat from the fixing jig 65, and hence there is a problem that the efficiency of cooling of the focus ring 63 cannot be improved as much as hoped.

Moreover, with the etching apparatus 75 described above, again the cooling unit 74 is necessary, and hence the initial cost increases; furthermore, if the cooling unit 74 is exposed to the plasma, then the cooling unit 74 will be consumed as plasma processing is carried out repeatedly, resulting in regular maintenance becoming necessary, and hence there is also a problem of the maintenance cost increasing.

Furthermore, with the other etching apparatus, the vacuum gap that exists between the electrostatic chuck and the focus ring has low thickness, and hence it is not possible to make the backside gas diffuse through the vacuum gap sufficiently, and as a result the heat transfer ability between the electrostatic chuck and the focus ring cannot be improved sufficiently. There is thus a problem that the efficiency of cooling of the focus ring cannot be improved as much as hoped.

Moreover, in general, plasma processing is comprised of a plurality of steps, and the magnitude of the high-frequency electrical power used to generate the plasma may be changed from step to step, and hence the temperature of the focus ring may change. However, the pressure of the backside gas and the voltage applied to the electrode built into the electrostatic chuck are not changed from step to step but rather are constant throughout the plasma processing, and hence the heat transfer ability between the focus ring and the electrostatic chuck does not change. There is thus a problem that changes in the temperature of the focus ring caused by changes in the magnitude of the high-frequency electrical power cannot be suppressed, and hence the efficiency of cooling of the focus ring cannot be improved.

SUMMARY OF THE INVENTION

It is an object of the present invention to provide a plasma processing apparatus, a focus ring, and a susceptor, which enable the efficiency of cooling of the focus ring to be greatly improved, while preventing an increase in cost.

To attain the above object, in a first aspect of the present invention, there is provided a plasma processing apparatus comprising, a susceptor having an electrostatic chuck on which is mounted an object to be processed that is to be subjected to plasma processing, and a focus ring having a contact portion disposed in contact with the electrostatic chuck, wherein the focus ring has a dielectric material portion that forms the contact portion, and a conductive material portion that faces the electrostatic chuck with the dielectric material portion therebetween.

According to the first aspect of the present invention, the focus ring has a dielectric material portion that forms a contact portion disposed in contact with an electrostatic chuck, and a conductive material portion that faces the electrostatic chuck with the dielectric material portion therebetween. As a result, when an object to be processed is subjected to plasma processing, the amount of charge for generating electrostatic attraction between the electrostatic chuck and the focus ring can be made high, and thus the electrostatic attraction between the electrostatic chuck and the focus ring can be increased, and hence the degree of close contact between the electrostatic chuck and the focus ring can be increased, and thus the heat transfer ability between the electrostatic chuck and the focus ring can be improved. The efficiency of cooling of the focus ring can thus be greatly improved, while preventing an increase in the cost of the susceptor.

Preferably, the dielectric material portion has a constant thickness in a radial direction of the focus ring.

According to this preferred form, the dielectric material portion has a constant thickness in a radial direction of the focus ring. As a result, the electrostatic attraction between the electrostatic chuck and the conductive material portion can be made constant and thus the degree of close contact between the electrostatic chuck and the focus ring can be made uniform. The focus ring can thus be cooled uniformly, and hence the occurrence of local deterioration of the etching characteristics can be prevented.

Preferably, the dielectric material portion is made of an oxide of a material constituting the conductive material portion.

According to this preferred form, the dielectric material portion is made of an oxide of a material constituting the conductive material portion. As a result, the dielectric material portion can be formed by oxidizing the conductive material portion. The focus ring can thus be formed easily, and moreover the occurrence of gaps between the dielectric material portion and the conductive material portion can be reliably prevented.

Preferably, the material constituting the conductive material portion is silicon.

According to this preferred form, the material constituting the conductive material portion is silicon. As a result, the material can be easily procured, and hence an increase in the cost of the susceptor can be further prevented.

Preferably, the material constituting the dielectric material portion is silicon dioxide.

According to this preferred form, the material constituting the dielectric material portion is silicon dioxide. As a result, the dielectric material portion can be formed easily, and hence an increase in the cost of the susceptor can be reliably prevented.

To attain the above object, in a second aspect of the present invention, there is provided a focus ring having a contact portion to be disposed in contact with an electrostatic chuck on which is mounted an object to be processed that is to be subjected to plasma processing, the focus ring comprising, a dielectric material portion that forms the contact portion, and a conductive material portion that faces the electrostatic chuck with the dielectric material portion therebetween.

According to the second aspect of the present invention, the focus ring has a dielectric material portion that forms a contact portion to be disposed in contact with an electrostatic chuck, and a conductive material portion that faces the electrostatic chuck with the dielectric material portion therebetween. As a result, when an object to be processed is subjected to plasma processing, the amount of charge for generating electrostatic attraction between the electrostatic chuck and the focus ring can be made high, and thus the electrostatic attraction between the electrostatic chuck and the focus ring can be increased, and hence the degree of close contact between the electrostatic chuck and the focus ring can be increased, and thus the heat transfer ability between the electrostatic chuck and the focus ring can be improved. The efficiency of cooling of the focus ring can thus be greatly improved, while preventing an increase in the cost of the susceptor.

To attain the above object, in a third aspect of the present invention, there is provided a susceptor comprising, an electrostatic chuck on which is mounted an object to be processed that is to be subjected to plasma processing, and a focus ring having a contact portion disposed in contact with the electrostatic chuck, wherein the focus ring has a dielectric material portion that forms the contact portion, and a conductive material portion that faces the electrostatic chuck with the dielectric material portion therebetween.

According to the third aspect of the present invention, the focus ring has a dielectric material portion that forms a contact portion disposed in contact with an electrostatic chuck, and a conductive material portion that faces the electrostatic chuck with the dielectric material portion therebetween. As a result, when an object to be processed is subjected to plasma processing, the amount of charge for generating electrostatic attraction between the electrostatic chuck and the focus ring can be made high, and thus the electrostatic attraction between the electrostatic chuck and the focus ring can be increased, and hence the degree of close contact between the electrostatic chuck and the focus ring can be increased, and thus the heat transfer ability between the electrostatic chuck and the focus ring can be improved. The efficiency of cooling of the focus ring can thus be greatly improved, while preventing an increase in the cost of the susceptor.

To attain the above object, in a fourth aspect of the present invention, there is provided a plasma processing apparatus comprising, a susceptor having an electrostatic chuck on which is mounted an object to be processed that is to be subjected to plasma processing, and a focus ring having a contact surface disposed in contact with the electrostatic chuck around a periphery of the object to be processed, and heat exchange means provided at the contact surface, for carrying out heat exchange with the focus ring.

According to the fourth aspect of the present invention, the plasma processing apparatus has heat exchange means at a contact surface between the electrostatic chuck and the focus ring. As a result, a cooling unit is not required between the electrostatic chuck and the focus ring, and moreover the heat transfer ability between the electrostatic chuck and the focus ring can be improved sufficiently, whereby the efficiency of cooling of the focus ring can be greatly improved, while preventing an increase in cost.

Preferably, the heat exchange means comprises a groove provided in the contact surface and filled with a heat transfer medium.

According to this preferred form, the heat exchange means comprises a groove provided in the contact surface and filled with a heat transfer medium. As a result, the heat transfer medium can be made to diffuse reliably between the electrostatic chuck and the focus ring, and hence the efficiency of cooling of the focus ring can be greatly improved.

More preferably, the heat transfer medium is a GALDEN™ fluid (fluorinated fluid).

According to this preferred form, the heat transfer medium is a GALDEN™ fluid (fluorinated fluid). As a result, the heat transfer medium can be easily procured, and hence an increase in cost can be reliably prevented.

More preferably, the groove is formed in the focus ring.

According to this preferred form, the groove is formed in the focus ring. As a result, the area of contact between the focus ring and the heat transfer medium can be increased, and moreover the rigidity of the focus ring can be suitably reduced, whereby the focus ring can be deformed to follow the shape of the electrostatic chuck, whereby the degree of close contact between the electrostatic chuck and the focus ring can be improved. As a result, the efficiency of cooling of the focus ring can be improved yet more greatly.

Alternatively, the groove is formed in the electrostatic chuck.

According to this preferred form, the groove is alternatively formed in the electrostatic chuck. As a result, there is no need to form a groove in the focus ring, whereby the initial cost of the focus ring can be reduced, and hence an increase in cost can be prevented.

More preferably, the groove has a depth of not less than 0.1 mm.

According to this preferred form, the groove has a depth of not less than 0.1 mm. As a result, the conductance can be made large (the flow resistance for the heat transfer medium can be decreased), and hence the heat transfer medium can be filled into the groove rapidly, whereby the efficiency of cooling of the focus ring can be improved markedly.

More preferably, the groove has corners thereof rounded off.

According to this preferred form, corners of the groove are rounded off. As a result, the occurrence of cracks in the groove can be prevented, and hence the durability of the focus ring can be improved, whereby an increase in the maintenance cost can be prevented.

More preferably, the groove comprises at least one groove having an annular shape concentric with the focus ring.

According to this preferred form, the groove comprises at least one groove having an annular shape concentric with the focus ring. As a result, the heat transfer medium can be made to diffuse uniformly over the contact surface between the focus ring and the electrostatic chuck, and hence the focus ring can be cooled uniformly.

Preferably, the heat exchange means comprises cooling means for cooling the focus ring.

According to this preferred form, the focus ring is cooled. As a result, a deposit generated during the etching treatment will become attached to the focus ring, and can thus be prevented from becoming attached to the object to be processed. The occurrence of particle contamination due to such deposit detaching from the object to be processed when the object to be processed is moved can thus be prevented.

Advantageously, the heat exchange means comprises a supply path that supplies a heat transfer gas to the contact surface, the plasma processing apparatus further comprising a controller that controls a pressure of the heat transfer gas supplied from the heat exchange means, and wherein the plasma processing comprises a plurality of steps, and the controller changes the pressure of the heat transfer gas supplied in accordance with each of the steps.

According to this preferred form, the controller advantageously changes the pressure of the heat transfer gas supplied in accordance with each of the steps of the plasma processing. As a result, even if a high-frequency voltage for plasma generation is changed from step to step, the heat transfer ability between the focus ring and the electrostatic chuck can be changed in accordance with the change in the high-frequency voltage, and hence the cooling of the focus ring can be carried out stably. The occurrence of local deterioration of the etching characteristics of the object to be processed can thus be prevented.

Advantageously, the plasma processing apparatus further comprises an electrode built into the electrostatic chuck in a manner facing the focus ring, and a controller that controls a voltage applied to the electrode, wherein the electrode attracts the focus ring to the electrostatic chuck by electrostatic attraction, the plasma processing comprises a plurality of steps, and the controller changes the voltage applied to the electrode in accordance with each of the steps.

According to this preferred form, the controller advantageously changes the voltage applied to an electrode built into the electrostatic chuck in accordance with each of the steps of the plasma processing. As a result, even if a high-frequency voltage for plasma generation is changed from step to step, the heat transfer ability between the focus ring and the electrostatic chuck can be changed in accordance with the change in the high-frequency voltage, and hence the cooling of the focus ring can be carried out stably. The occurrence of local deterioration of the etching characteristics of the object to be processed can thus be prevented.

More preferably, the heat exchange means reduces a temperature of the focus ring to at least 20° C. below a temperature of the electrostatic chuck.

According to this preferred form, the temperature of the focus ring is reduced to at least 20° C. below the temperature of the electrostatic chuck. As a result, the deposit can be attached to the focus ring reliably.

Still more preferably, the heat exchange means reduces the temperature of the focus ring to not more than 0° C.

According to this preferred form, the temperature of the focus ring is reduced to not more than 0° C. As a result, the deposit can be attached to the focus ring yet more reliably.

Advantageously, the heat exchange means comprises heating means for heating the focus ring.

According to this preferred form, the focus ring is advantageously heated. As a result, attached deposit can be removed. The focus ring replacement cycle can thus be lengthened, and hence the maintenance cost can be reduced.

Alternatively, the focus ring further comprises second heating means for heating the focus ring.

According to this preferred form, the focus ring alternatively comprises second heating means for heating the focus ring. As a result, the structure of the heat exchange means can be simplified, and hence the initial cost of the apparatus can be reduced.

Alternatively, the focus ring is exposed to a cleaning gas.

According to this preferred form, the focus ring may be exposed to a cleaning gas. As a result, deposit attached to the focus ring can be easily removed.

Alternatively, the focus ring is exposed to a plasma.

According to this preferred form, the focus ring may be exposed to the plasma. As a result, deposit attached to the focus ring can be removed during the plasma processing. The deposit can thus be removed without reducing the efficiency of the plasma processing.

Alternatively, the heat exchange means comprises a Peltier device.

According to this preferred form, the heat exchange means alternatively comprises a Peltier device. As a result, a heat transfer medium is not required. The structure of the heat exchange means can thus be simplified, and hence the initial cost of the apparatus can be reduced.

To attain the above object, in a fifth aspect of the present invention, there is provided a focus ring having a contact surface to be disposed in contact with an electrostatic chuck on which is mounted an object to be processed that is to be subjected to plasma processing, around a periphery of the object to be processed, the focus ring comprising, heat exchange means provided at the contact surface, for carrying out heat exchange with the focus ring.

According to the fifth aspect of the present invention, the focus ring has heat exchange means at a contact surface between the electrostatic chuck and the focus ring. As a result, a cooling unit is not required between the electrostatic chuck and the focus ring, and moreover the heat transfer ability between the electrostatic chuck and the focus ring can be improved sufficiently, whereby the efficiency of cooling of the focus ring can be greatly improved, while preventing an increase in cost.

To attain the above object, in a sixth aspect of the present invention, there is provided a susceptor comprising, an electrostatic chuck on which is mounted an object to be processed that is to be subjected to plasma processing, a focus ring having a contact surface disposed in contact with the electrostatic chuck around a periphery of the object to be processed, and heat exchange means provided at the contact surface, for carrying out heat exchange with the focus ring.

According to the sixth aspect of the present invention, the susceptor has heat exchange means at a contact surface between the electrostatic chuck and the focus ring. As a result, a cooling unit is not required between the electrostatic chuck and the focus ring, and moreover the heat transfer ability between the electrostatic chuck and the focus ring can be improved sufficiently, whereby the efficiency of cooling of the focus ring can be greatly improved, while preventing an increase in cost.

The above and other objects, features, and advantages of the invention will become more apparent from the following detailed description taken in conjunction with the accompanying drawings.

BRIEF DESCRIPTION OF THE DRAWINGS

FIG. 7A is a view showing a focus ring as viewed from a contact surface thereof; and FIG. 7B is a sectional view taken along line III-III in FIG. 7A;

DETAILED DESCRIPTION OF THE PREFERRED EMBODIMENTS

The present invention will now be described in detail with reference to the drawings showing preferred embodiments thereof.

Figure 1:
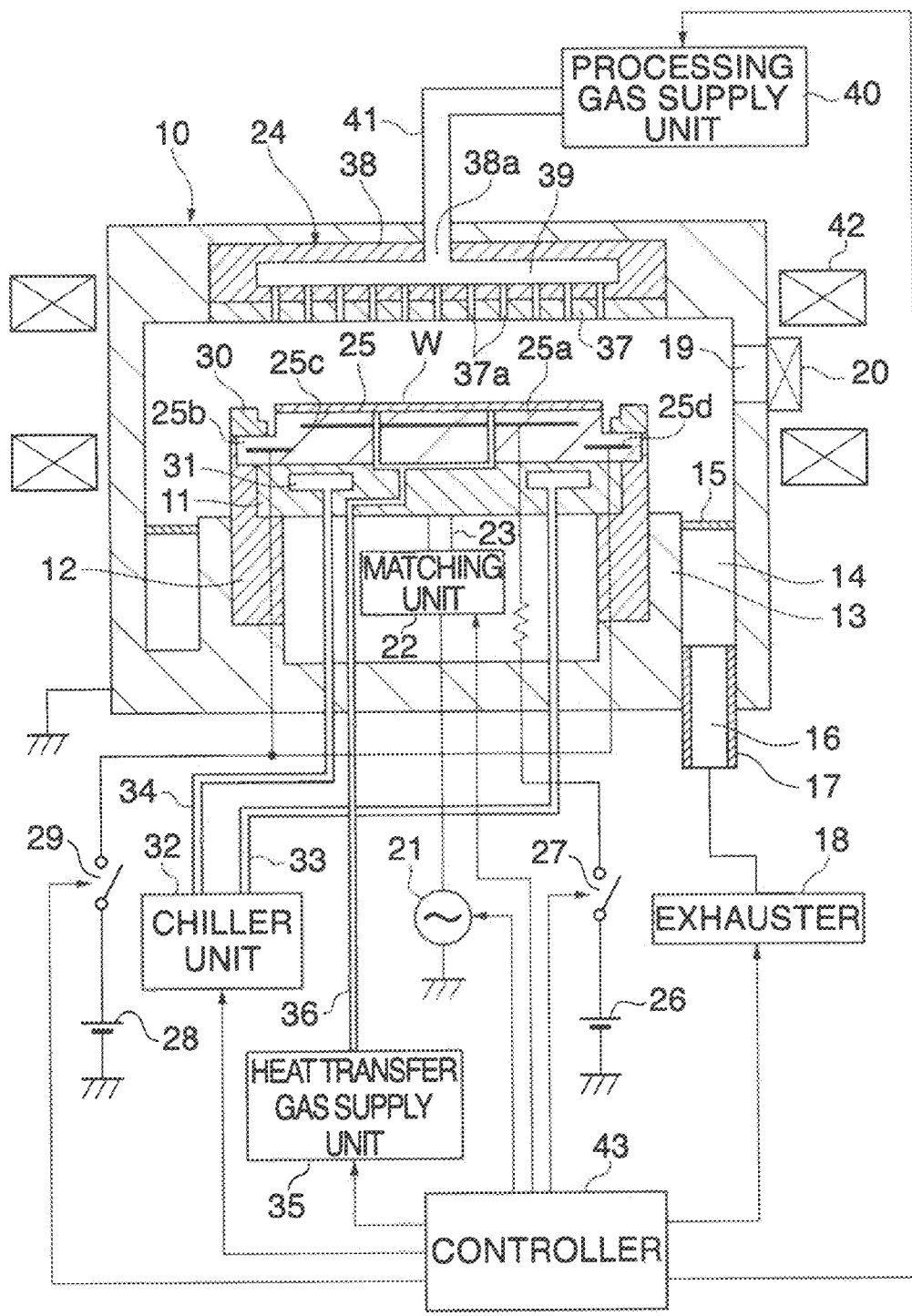
FIG. 1 is a schematic sectional view showing the construction of a plasma processing apparatus in which can be used a susceptor according to a first embodiment of the present invention.

FIG. 1 is a schematic sectional view showing the construction of a plasma processing apparatus in which can be used the susceptor according to a first embodiment of the present invention.

In FIG. 1, the plasma processing apparatus, which is constructed as an RIE type plasma processing apparatus, has a cylindrical chamber 10 that is made of a metal, for example aluminum or stainless steel, and is grounded for safety; the chamber 10 has provided therein a disk-shaped lower electrode 11 on which a wafer W is mounted as an object to be processed. The lower electrode 11 is made, for example, of aluminum, and is supported via an insulating cylindrical holding member 12 by a cylindrical holding portion 13 that extends perpendicularly upwards from a base of the chamber 10.

An exhaust path 14 is formed between a side wall of the chamber 10 and the cylindrical holding portion 13; an annular baffle plate 15 is provided at an inlet of the exhaust path 14 or in the exhaust path 14, and an exhaust port 16 is provided in a bottom portion of the exhaust path 14, and an exhauster 18 is connected to the exhaust port 16 via an exhaust pipe 17. Here, the exhauster 18 has a vacuum pump, and reduces the pressure of a processing space in the chamber 10 down to a predetermined degree of vacuum. Moreover, the exhaust pipe 17 has an automatic pressure control valve (hereinafter referred to as the "APC"), (not shown), which is a variable butterfly valve, and this APC automatically controls the pressure inside the chamber 10. Furthermore, a gate valve 20 that opens and closes a wafer W conveying in/out port 19 is installed on a side wall of the chamber 10.

A high-frequency power source 21 for plasma production and RIE is electrically connected to the lower electrode 11 via a matching unit 22 and a power-feeding rod 23. The high-frequency power source 21 applies high-frequency electrical power at a predetermined high frequency, for example 60 MHz, to the lower electrode 11. Moreover, a shower head 24 is provided, as an upper electrode at a ground potential, described later, in a ceiling portion of the chamber 10. A high-frequency voltage from the high-frequency power source 21 is thus applied between the lower electrode 11 and the shower head 24.

An electrostatic chuck 25 that attracts the wafer W thereto through electrostatic attraction is provided on an upper surface of the lower electrode 11. The electrostatic chuck 25 is comprised of a disk-shaped central portion 25a, and an annular outer peripheral portion 25b; the central portion 25a projects out (upward in FIG. 1) relative to the outer peripheral portion 25b. Moreover, the central portion 25a is constructed by sandwiching an electrode plate 25c comprised of a conductive film between a pair of dielectric films, and the outer peripheral portion 25b is constructed by sandwiching an electrode plate 25d comprised of a conductive film between a pair of dielectric films; furthermore, a DC power source 26 is electrically connected to the electrode plate 25c via a switch 27, and a DC power source 28 is electrically connected to the electrode plate 25d via a switch 29. The electrostatic chuck 25 attracts and holds the wafer W through a Johnsen-Rahbek force or a Coulomb force due to the DC voltage from the DC power source 26.

A focus ring 30 that annularly surrounds the central portion 25a of the electrostatic chuck 25 is mounted on an upper surface of the outer peripheral portion 25b of the electrostatic chuck 25. The lower electrode 11, the electrostatic chuck 25 and the focus ring 30 together constitute a susceptor.

Moreover, inside the lower electrode 11 is provided an annular coolant chamber 31 that, for example, extends in a circumferential direction. A coolant, for example cooling water, at a predetermined temperature is supplied into the coolant chamber 31 from a chiller unit 32 and circulated via piping 33 and 34, and the processing temperature of the wafer W on the electrostatic chuck 25 is controlled through the temperature of this coolant. Furthermore, a heat transfer gas, for example He gas, from a heat transfer gas supply unit 35 is supplied into a gap between an upper surface of the electrostatic chuck 25 and a rear surface of the wafer W via a gas supply line 36, thus improving heat transfer ability between the wafer W and the electrostatic chuck 25.

The shower head 24 in the ceiling portion has a lower surface electrode plate 37 having a large number of gas vents 37a therein, and an electrode support 38 that detachably supports the electrode plate 37. Moreover, a buffer chamber 39 is provided inside the electrode support 38, and gas supply piping 41 from a processing gas supply unit 40 is connected to a gas introduction port 38a of the buffer chamber 39. Moreover, a magnet 42 that extends annularly or concentrically is disposed around the chamber 10.

The component elements of the plasma processing apparatus, for example the exhauster 18, the high-frequency power source 21, the switches 27 and 29 for the electrostatic chuck 25, the chiller unit 32, the heat transfer gas supply unit 35, the processing gas supply unit 40 and so on, are connected to a controller 43 that controls the operation of these component elements.

Inside the chamber 10 of the plasma processing apparatus, a horizontal magnetic field oriented in one direction is formed by the magnet 42, and moreover an RF (radio-frequency, i.e. high-frequency) electric field is formed in a perpendicular direction by the high-frequency voltage applied between the lower electrode 11 and the shower head 24; as a result, magnetron discharge occurs via the processing gas in the chamber 10, and hence a high-density plasma is produced from the processing gas in the vicinity of the surface of the lower electrode 11.

With this plasma processing apparatus, during dry etching processing, first the gate valve 20 is opened, and the wafer W to be processed is conveyed into the chamber 10, and mounted on the electrostatic chuck 25. A processing gas (e.g. a mixed gas comprised of $C_4F_8$ gas, $O_2$ gas and Ar gas with a predetermined flow rate ratio therebetween) is introduced at a predetermined amount of flow and a predetermined flow rate from the processing gas supply unit 40 into the chamber 10, and the pressure inside the chamber 10 is set to a predetermined value using the exhauster 18 and so on. Furthermore, high-frequency electrical power is supplied to the lower electrode 11 from the high-frequency power source 21, and a DC voltage is applied to the electrode plate 25c of the electrostatic chuck 25 from the DC power source 26, thus attracting the wafer W to the electrostatic chuck 25. The processing gas discharged from the shower head 24 is made into a plasma as described above, and a surface of the wafer W is etched by radicals, ions or the like produced through this plasma.

With this plasma processing apparatus, by applying a high frequency in a frequency range (at least 50 MHz) much higher than conventionally (generally not more than 27 MHz) to the lower electrode 11, the processing gas is dissociated into a desirable state. The dissociated processing gas is made into a plasma, and hence a high-density plasma can be formed even at a low pressure. With such a high-density plasma, oxidation and nitriding processing can be carried out with little damage to the wafer W, and thus the high-density plasma greatly contributes to realization of high performance and low power consumption of semiconductor devices. Specifically, it is possible to prevent breakage and contamination of the wafer W due to high energy particles in the plasma, and metallic atoms emitted, for example, from inner walls of the processing chamber, which is caused by collision by the high energy particles, and hence the plasma processing can be applied to a gate formation step which requires formation of high quality insulation films. Therefore, the plasma processing apparatus according to the present embodiment can solve technical problems which may arise with development of ultrafine processing for the wafer W.

Figure 2:
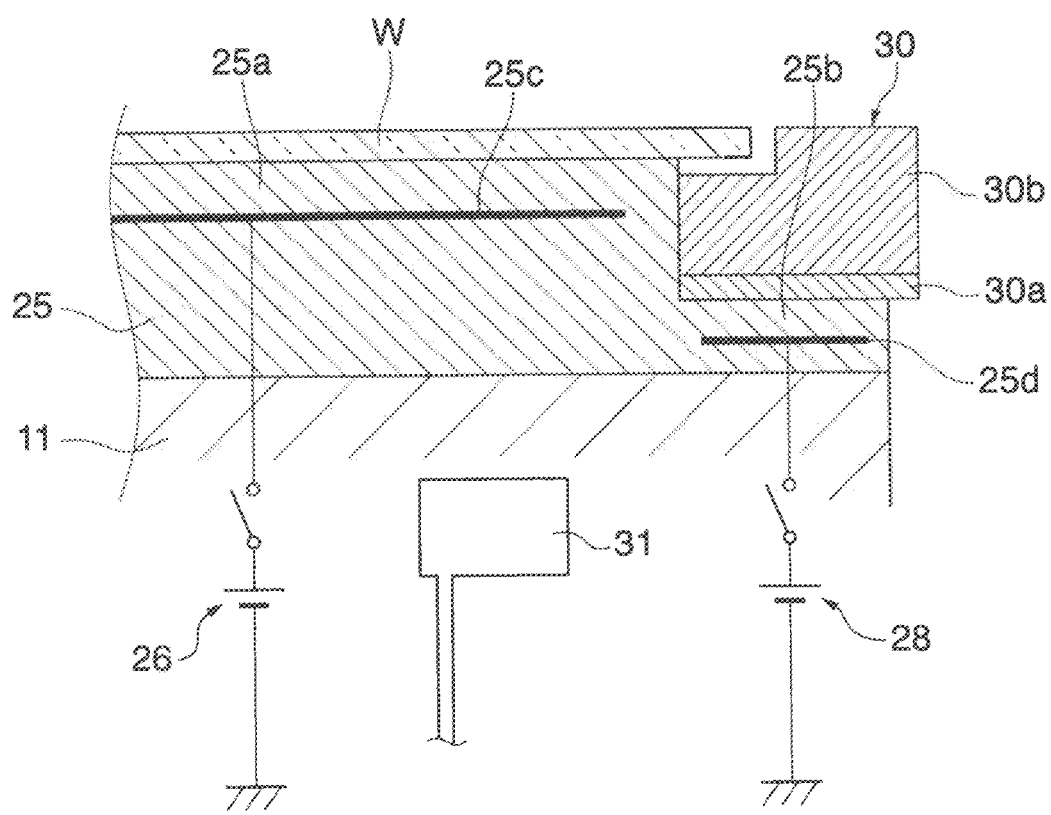
FIG. 2 is a schematic sectional view showing the construction of the susceptor according to the first embodiment.

FIG. 2 is a schematic sectional view showing the construction of the susceptor according to the first embodiment.

The susceptor according to the first embodiment can be used in a plasma processing apparatus in which a film to be etched of the wafer W is an oxide film.

As shown in FIG. 2 and as described above, the susceptor according to the first embodiment is comprised of a lower electrode 11, the electrostatic chuck 25, which is disposed on the upper surface of the lower electrode 11, and the focus ring 30, which is mounted on the upper surface of the outer peripheral portion 25b of the electrostatic chuck 25.

The lower electrode 11 has the coolant chamber 31 therein, the electrostatic chuck 25 has the electrode plate 25c inside the central portion 25a thereof and has the electrode plate 25d inside the outer peripheral portion 25b thereof, and the focus ring 30 has a dielectric material portion 30a that forms a contact portion disposed in contact with the outer peripheral portion 25b, and a conductive material portion 30b that faces the outer peripheral portion 25b with the dielectric material portion 30a therebetween.

Here, because the film to be etched of the wafer W is an oxide film, a part of the focus ring 30 that will be exposed to the plasma is preferably made of silicon (Si), and hence the conductive material portion 30b is made of silicon, and the dielectric material portion 30a is made of silicon dioxide ($SiO_2$), which is an oxide of silicon.

When subjecting the wafer W to dry etching processing, high-frequency electrical power is supplied to the lower electrode 11 by the high-frequency power source 21 to produce a plasma, and a high voltage is applied to the electrode plate 25c from the DC power source 26 to attract the wafer W to the central portion 25a by electrostatic attraction, and a high voltage is applied to the electrode plate 25d from the DC power source 28 to attract the focus ring 30 to the outer peripheral portion 25b by electrostatic attraction. The high voltages applied to the electrode plates 25c and 25d are controlled by the controller 43. When the plasma is produced, with the conventional focus ring made of only a conductive material, the whole of the focus ring becomes at a negative potential as with the plasma, but because nothing exists to block the flow of charge between the focus ring and the electrostatic chuck, the negative charge on the focus ring flows out to the electrostatic chuck via the contact surface between the focus ring and the electrostatic chuck. The charge that gives rise to the electrostatic attraction between the focus ring and the electrostatic chuck is thus reduced. On the other hand, with the focus ring 30 according to the first embodiment of the present invention, the conductive material portion 30b becomes at a negative potential as with the plasma, and hence a positive charge is induced in the dielectric material portion 30a at the interface of the dielectric material portion 30a with the conductive material portion 30b, and thus a negative charge arises through dielectric polarization in the dielectric material portion 30a at the interface of the dielectric material portion 30a with the electrostatic chuck 25. Moreover, in the case that a surface portion of the electrostatic chuck 25 is made of a dielectric material, a positive charge will arise through dielectric polarization in the surface portion of the electrostatic chuck 25 at the interface of the surface portion of the electrostatic chuck 25 with the dielectric material portion 30a. The electrostatic attraction between the electrostatic chuck 25 and the focus ring 30 can be increased through the action of these charges.

At this time, the voltage applied to the electrode plate 25d by the DC power source 28 is determined by the specific resistance of the dielectric material portion 30a. Specifically, if the specific resistance is at least 1013Ω, then the electrostatic attraction generated by the charge induced in the conductive material portion 30b will be a Coulomb force, and hence the applied voltage will be approximately 1.5 to 4.0 kV, whereas if the specific resistance is less than 1013Ω, then the above electrostatic attraction will be a Johnsen-Rahbek force, and hence the applied voltage will be approximately 0 to 1.0 kV.

Moreover, the thickness of the dielectric material portion 30a is constant in the radial direction of the focus ring 30; the greater the thickness of the dielectric material portion 30a, the worse the heat transfer ability between the electrostatic chuck 25 and the conductive material portion 30b, and hence it is preferable for this thickness to be low. However, in the present first embodiment, the film to be etched of the wafer W is an oxide film, and hence the dielectric material portion 30a, which is made of silicon dioxide, will be consumed as the plasma processing is carried out repeatedly. It is thus necessary for the thickness of the dielectric material portion 30a to be at least the thickness that will be consumed during one maintenance cycle.

According to the susceptor of the first embodiment, the focus ring 30 is comprised of a dielectric material portion 30a that forms a contact portion disposed in contact with the outer peripheral portion 25b, and a conductive material portion 30b that faces the outer peripheral portion 25b of the electrostatic chuck 25 with the dielectric material portion 30a therebetween. As a result, when the wafer W is subjected to the dry etching processing, flow of charge from the dielectric material portion 30a of the focus ring 30 to the electrostatic chuck 25 via the contact portion can be blocked, and hence the loss of charge that gives rise to the electrostatic attraction can be suppressed compared with the conventional focus ring; the electrostatic attraction between the electrostatic chuck 25 and the focus ring 30 can thus be increased, and hence the degree of close contact between the electrostatic chuck 25 and the focus ring 30 can be increased, and thus the heat transfer ability between the electrostatic chuck 25 and the focus ring 30 can be improved. As a result, the efficiency of cooling of the focus ring 30 can be greatly improved, while preventing an increase in the cost of the susceptor.

Moreover, the thickness of the dielectric material portion 30a is constant in the radial direction of the focus ring 30, and hence the electrostatic attraction between the electrostatic chuck 25 and the focus ring 30 can be made constant and thus the degree of close contact between the electrostatic chuck 25 and the focus ring 30 can be made uniform; the focus ring 30 can thus be cooled uniformly, and hence the occurrence of local deterioration of the etching characteristics can be prevented.

Furthermore, the material constituting the conductive material portion 30b is silicon, and hence procuring the material is easy, and thus an increase in the cost of the susceptor can be further prevented. Furthermore, the material constituting the dielectric material portion 30a is silicon dioxide, and hence the dielectric material portion 30a can easily be formed by sputtering or the like, and thus an increase in the cost of the susceptor can be reliably prevented; moreover, with a dielectric material portion 30a formed by sputtering, the surface of the contact portion with the focus ring 30 can be made smooth, and hence the degree of close contact between the electrostatic chuck 25 and the focus ring 30 can be further improved.

Figure 3:
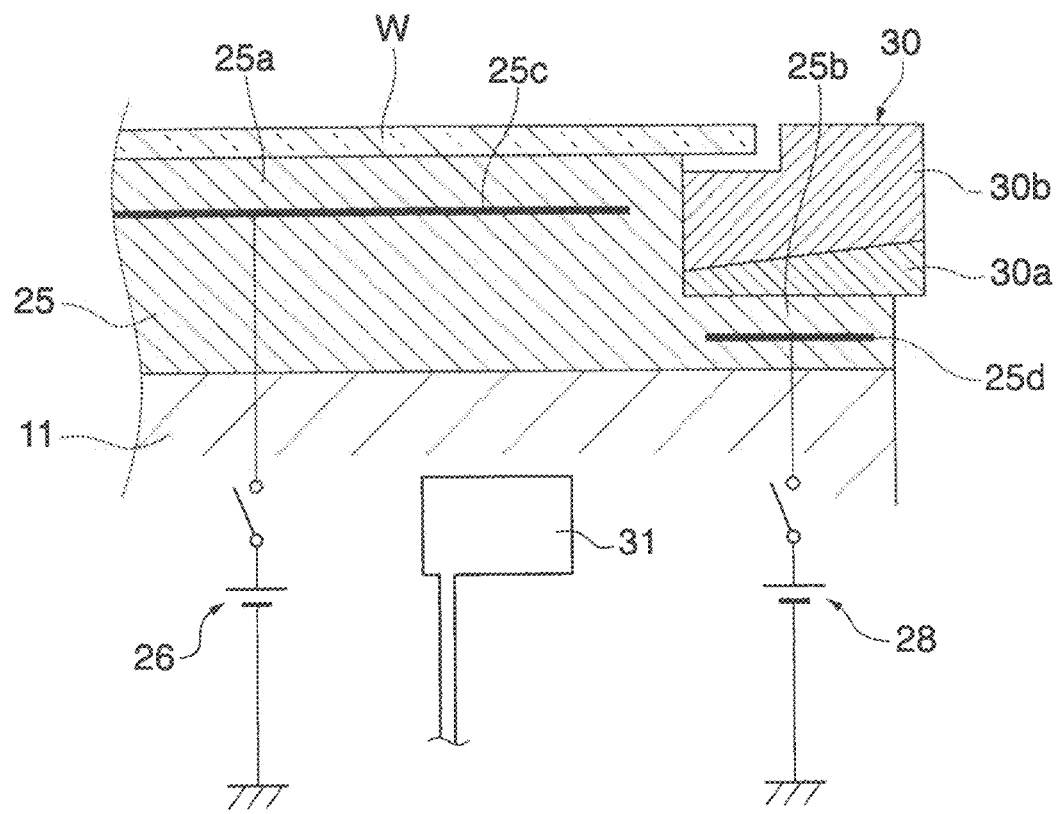
FIG. 3 is a schematic sectional view showing the construction of a susceptor according to a variation of the first embodiment.
Figure 4:
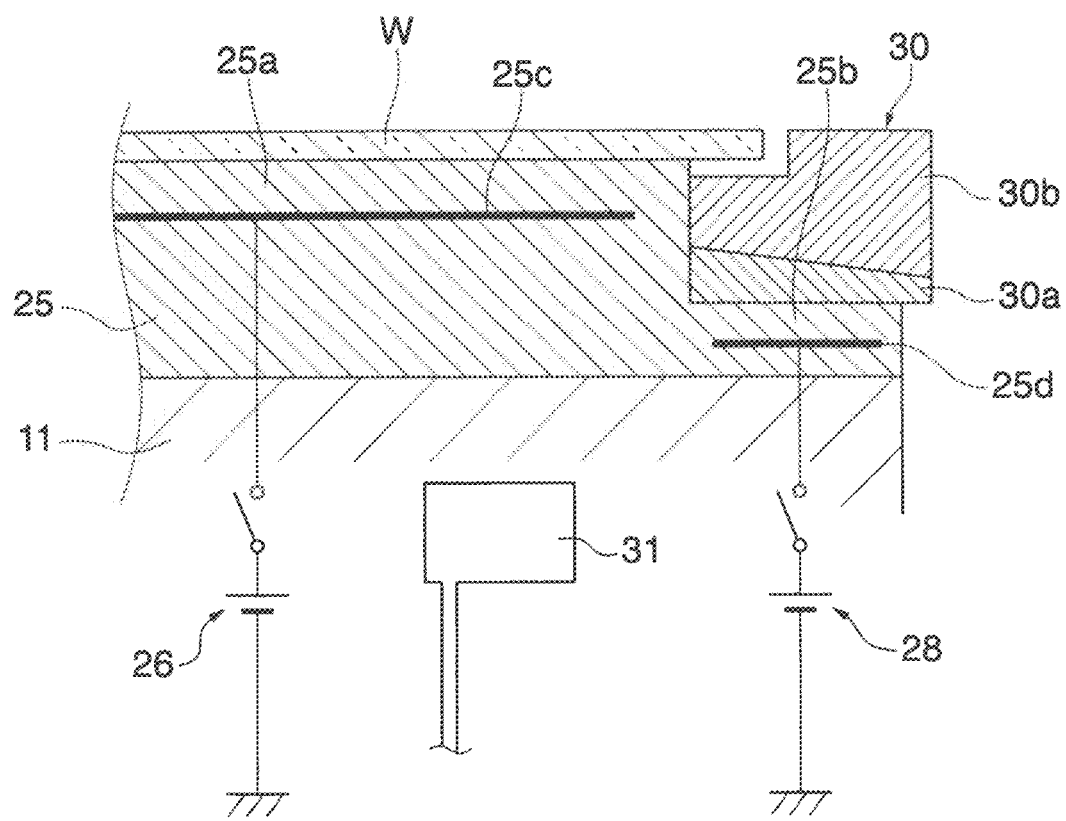
FIG. 4 is a schematic sectional view showing the construction of a susceptor according to another variation of the first embodiment.

According to the susceptor according to the first embodiment described above, the thickness of the dielectric material portion 30a is constant in the radial direction of the focus ring 30; however, the dielectric material portion 30a may be constructed such that the thickness thereof increases from the inside of the focus ring 30 outward as shown in FIG. 3, or may be constructed such that the thickness thereof increases from the outside of the focus ring 30 inward as shown in FIG. 4.

Moreover, the dielectric material portion 30a may be constructed such that the dielectric constant thereof increases from the inside of the focus ring 30 outward, or may be constructed such that the dielectric constant thereof increases from the outside of the focus ring 30 inward.

Next, a susceptor according to a second embodiment of the present invention will be described in detail.

The susceptor according to the second embodiment has basically the same construction and operation as in the first embodiment described above, and hence description of aspects of the construction and operation that overlap with the first embodiment will be omitted, and in the following only aspects of the construction and operation that differ to the first embodiment will be described.

Figure 5:
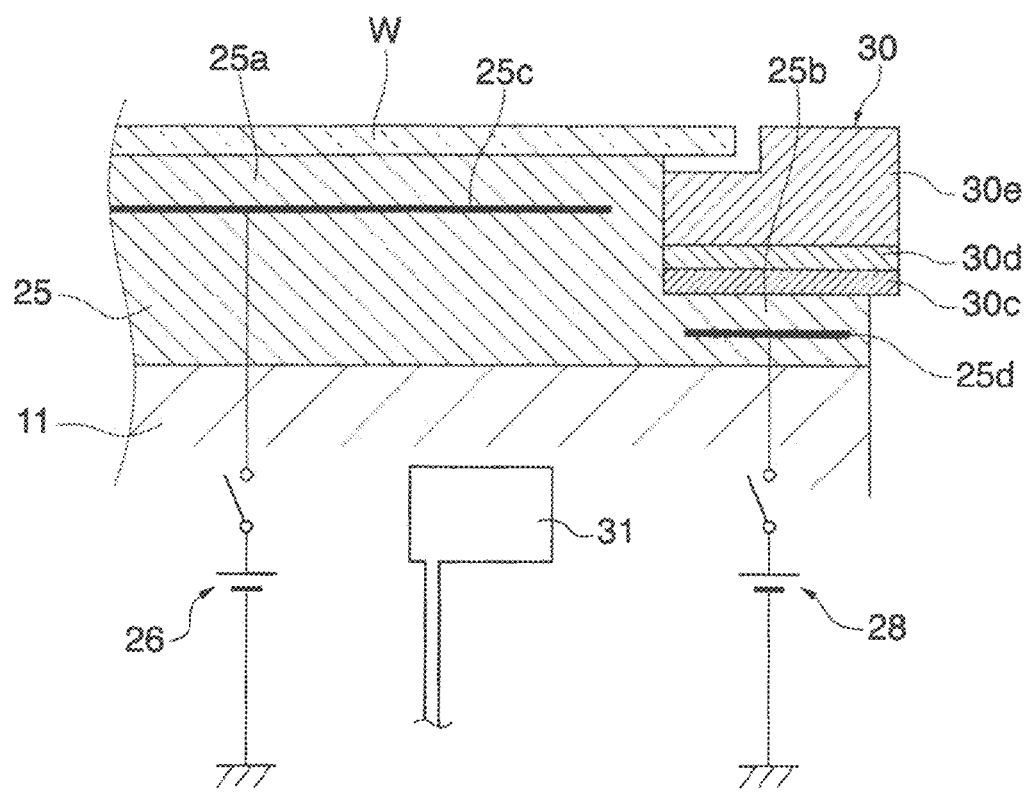
FIG. 5 is a schematic sectional view showing the construction of a susceptor according to a second embodiment of the present invention.

FIG. 5 is a schematic sectional view showing the construction of the susceptor according to the second embodiment.

The susceptor according to the second embodiment can be used in a plasma processing apparatus in which a film to be etched of the wafer W is a polysilicon film.

As shown in FIG. 5, according to the susceptor of the second embodiment, the focus ring 30 is comprised of a dielectric material portion 30c that forms a contact portion disposed in contact with the outer peripheral portion 25b of the electrostatic chuck 25, a conductive material portion 30d that faces the outer peripheral portion 25b with the dielectric material portion 30c therebetween, and another dielectric material portion 30e that is disposed on the conductive material portion 30d.

The lower electrode 11 and the electrostatic chuck 25 are identical in construction with the first embodiment.

Here, because the film to be etched of the wafer W is a polysilicon film, a part of the focus ring 30 that will be exposed to the plasma is preferably made of a material other than silicon, and hence the other dielectric material portion 30e is made of silicon dioxide. Moreover, the dielectric material portion 30c is also made of silicon dioxide, and the conductive material portion 30d is made of silicon; part of the conductive material portion 30d is exposed to and contacts the plasma.

When subjecting the wafer W to dry etching processing, the DC power source 28 applies a high voltage to the electrode plate 25d. When the plasma is produced, the conductive material portion 30d disposed in contact with the plasma becomes at a negative potential as with the plasma, and hence a positive charge is induced in the dielectric material portion 30c at the interface of the dielectric material portion 30c with the conductive material portion 30d, and thus a negative charge arises through dielectric polarization in the dielectric material portion 30c at the interface of the dielectric material portion 30c with the electrostatic chuck 25. Moreover, in the case that a surface portion of the electrostatic chuck 25 is made of a dielectric material, a positive charge will arise through dielectric polarization in the surface portion of the electrostatic chuck 25 at the interface of the surface portion of the electrostatic chuck 25 with the dielectric material portion 30c. The electrostatic attraction between the electrostatic chuck 25 and the focus ring 30 can be increased through the action of these charges.

Here, with the conventional focus ring made of only a dielectric material, assuming that the electrode plate 25d and the plasma are two electrodes of a capacitor, even if it is considered that charge will be accumulated in the dielectric material (focus ring) interposed between the two electrodes, because the thickness of the dielectric material is too great, the capacitance of the capacitor will be insufficient, i.e. it will not be possible to accumulate a large amount of charge for generating electrostatic attraction. On the other hand, with the focus ring 30 according to the second embodiment of the present invention, assuming that the electrode plate 25d and the conductive material portion 30d are two electrodes of a capacitor, the dielectric material interposed between the two electrodes is the dielectric material portion 30c, which is sufficiently thin compared with the conventional focus ring, and hence the capacitance of the capacitor can be made large, i.e. a large amount of charge for generating electrostatic attraction can be accumulated.

The thicknesses of the dielectric material portion 30c and the conductive material portion 30d are constant in the radial direction of the focus ring 30, and it is preferable for each of these thicknesses to be low. However, in the present second embodiment, the film to be etched of the wafer W is a polysilicon film, and hence the conductive material portion 30d, which is made of silicon, will be consumed as the plasma processing is carried out repeatedly. It is thus necessary for the thickness of the conductive material portion 30d to be at least the thickness that will be consumed during one maintenance cycle.

According to the susceptor of the second embodiment, the focus ring 30 has a dielectric material portion 30c that forms a contact portion disposed in contact with the outer peripheral portion 25b of the electrostatic chuck 25, and a conductive material portion 30d that faces the outer peripheral portion 25*b* with the dielectric material portion 30*c* therebetween. As a result, when the wafer W is subjected to the dry etching processing, the amount of charge for generating electrostatic attraction can be made high, and thus the electrostatic attraction between the electrostatic chuck 25 and the focus ring 30 can be increased, and hence the degree of close contact between the electrostatic chuck 25 and the focus ring 30 can be increased, and thus the heat transfer ability between the electrostatic chuck 25 and the focus ring 30 can be improved. As a result, the efficiency of cooling of the focus ring 30 can be greatly improved, while preventing an increase in the cost of the susceptor.

Here, according to the susceptor of the second embodiment, the thickness of the dielectric material portion 30*c* is constant in the radial direction of the focus ring 30; however, as with the susceptor according to the first embodiment described earlier, the dielectric material portion 30*c* may be constructed such that the thickness thereof increases from the inside of the focus ring 30 outward or from the outside of the focus ring 30 inward, and moreover the dielectric material portion 30*c* may be constructed such that the dielectric constant thereof increases from the inside of the focus ring 30 outward or from the outside of the focus ring 30 inward.

According to each of the susceptors of the first and second embodiments described above, silicon is used as the material constituting the conductive material portion, but any material that will become negatively charged upon contacting the plasma may be used as the material constituting the conductive material portion, for example aluminum (Al), a semiconductor, or the like may be used. As a result, the charge induced in the conductive material portion can be further increased, and hence the degree of close contact between the electrostatic chuck 25 and the focus ring 30 can be further increased, and thus the heat transfer ability between the electrostatic chuck 25 and the focus ring 30 can be further improved.

Moreover, according to each of the susceptors of the first and second embodiments described above, silicon dioxide is used as the material constituting the dielectric material portion(s), but any insulating material (especially a material having a high dielectric constant) may be used as the material constituting the dielectric material portion(s), for example silicon nitride (SiN), alumite, or the like may be used. Here, if an oxide of the material constituting the conductive material portion is used as the material constituting the dielectric material portion(s), then the dielectric material portion(s) can be formed by oxidizing the conductive material portion. The focus ring 30 can thus be formed easily, and moreover the occurrence of gaps between the dielectric material portion(s) and the conductive material portion can be prevented, and hence the charge induced in the conductive material portion can be further increased.

Moreover, the method of forming the dielectric material portion(s) is not limited to sputtering, but rather CVD, dipping and so on may be used as appropriate in accordance with the material.

Moreover, according to each of the susceptors of the first and second embodiments described above, the electrostatic chuck 25 and the dielectric material portion 30*a* or 30*c* contact one another directly, but a heat-resistant elastic member made of conductive silicone rubber or the like may be interposed between the electrostatic chuck 25 and the dielectric material portion 30*a* or 30*c*, whereby the heat transfer ability between the electrostatic chuck 25 and the focus ring 30 can be further improved. Moreover, helium gas may be filled between the electrostatic chuck 25 and the dielectric material portion 30*a* or 30*c* as a backside gas, whereby again the heat transfer ability can be further improved.

Next, a susceptor according to a third embodiment of the present invention will be described in detail.

The susceptor according to the third embodiment has basically the same construction and operation as in the first embodiment described earlier, and hence description of aspects of the construction and operation that overlap with the first embodiment will be omitted, and in the following only aspects of the construction and operation that differ to the first embodiment will be described.

According to the susceptor of the third embodiment, as will be described below, the heat transfer gas (heat transfer medium), for example He gas, from the heat transfer gas supply unit 35 is supplied via a gas supply line 46 into a gap between an upper surface of the central portion 25*a* of the electrostatic chuck 25 and a rear surface of the wafer W, a gap between an upper surface of the outer peripheral portion 25*b* of the electrostatic chuck 25 and a rear surface of the focus ring 30, and a gap between the lower electrode 11 and the electrostatic chuck 25, thus improving the heat transfer ability between the wafer W and the electrostatic chuck 25, between the focus ring 30 and the electrostatic chuck 25, and between the electrostatic chuck 25 and the lower electrode 11.

Figure 6:
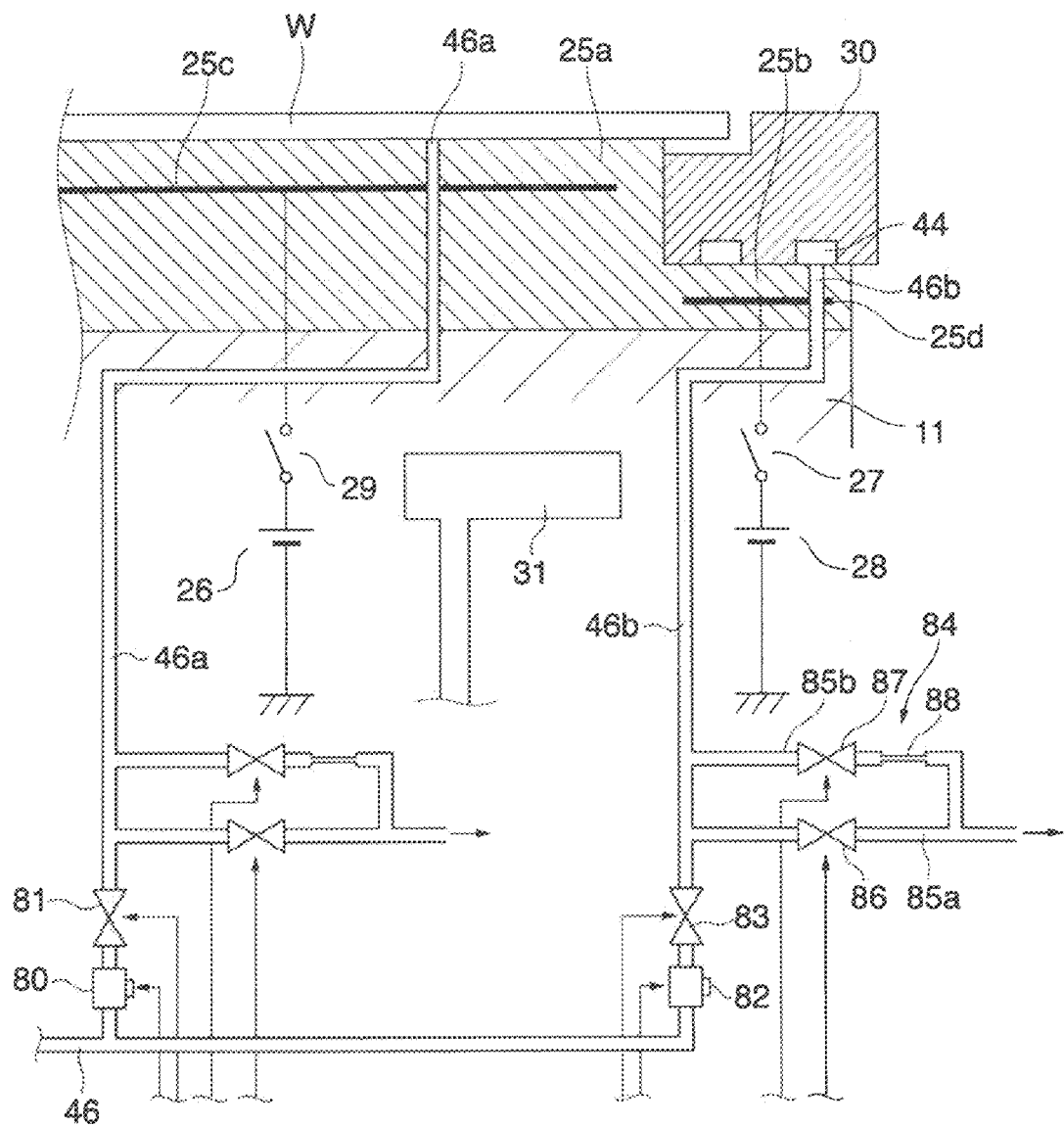
FIG. 6 is a schematic sectional view showing the construction of a susceptor according to a third embodiment of the present invention.

FIG. 6 is a schematic sectional view showing the construction of the susceptor according to the third embodiment.

As shown in FIG. 6, as with the susceptor according to the first embodiment, the susceptor according to the third embodiment is comprised of a lower electrode 11, an electrostatic chuck 25 disposed on an upper surface of the lower electrode 11, and a focus ring 30 mounted on an upper surface of an outer peripheral portion 25*b* of the electrostatic chuck 25.

Figure 7A:
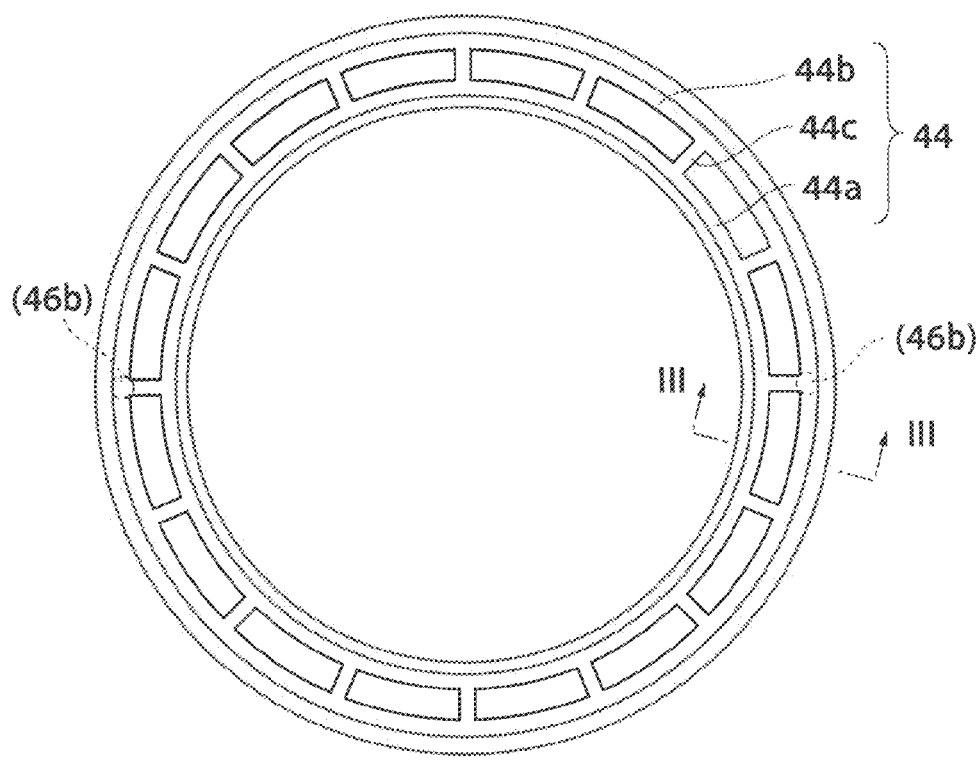
FIGS. 7A and 7B are schematic views showing the construction of a heat transfer gas introduction groove appearing in FIG. 6; specifically.

Here, the gas supply line 46 has a wafer section line 46*a* that opens out at the upper surface of the central portion 25*a*, and a focus ring section line 46*b* that opens out at two places in the upper surface of the outer peripheral portion 25*b*; the two openings of the focus ring section line 46*b* are disposed in the upper surface of the outer peripheral portion 25*b* symmetrically such that the center of the central portion 25*a* is midway between the two openings (see FIG. 7A).

The wafer section line 46*a* has a PCV (pressure control valve) 80 and an opening/closing valve 81; the PCV 80 and the opening/closing valve 81 are connected to the controller 43, which controls the operation of the PCV 80 and the opening/closing valve 81. The PCV 80 controls the pressure of the He gas supplied onto the rear surface of the wafer W from the wafer section line 46*a*, and the opening/closing valve 81 closes off the wafer section line 46*a* from the heat transfer gas supply unit 35 in response to a command from the controller 43.

The focus ring section line 46*b* also has a PCV 82 and an opening/closing valve 83; the PCV 82 and the opening/closing valve 83 are connected to the controller 43, which controls the operation of the PCV 82 and the opening/closing valve 83. The PCV 82 controls the pressure of the He gas supplied into a heat transfer gas introduction groove 44, described below, by the focus ring section line 46*b*, and the opening/closing valve 83 closes off the focus ring section line 46*b* from the heat transfer gas supply unit 35 in response to a command from the controller 43.

Moreover, the focus ring section line 46*b* has a chamber release system 84 between the openings of the focus ring section line 46*b* and the opening/closing valve 83. The chamber release system 84 is comprised of two lines 85*a* and 85*b*. The lines 85*a* and 85*b* are each communicated at one end thereof with the focus ring section line 46*b*, and are connected at the other end thereof to one another to form a single line, which is communicated with the interior of the chamber 10.

The line 85a has an opening/closing valve 86, and the line 85b has an opening/closing valve 87 and a constriction 88. The opening/closing valves 86 and 87 are connected to the controller 43, which controls the operation of the opening/closing valves 86 and 87.

Furthermore, the wafer section line 46a may also have a system similar to the chamber release system 84, as shown in FIG. 6.

It is preferable that a plurality of wafer section lines 46a are provided, each opening in the upper surface of the central portion 25a in a manner facing a central portion and a peripheral portion of the rear surface of the wafer W, whereby the temperature of the wafer W can be appropriately controlled.

Moreover, the focus ring 30 has a heat transfer gas introduction groove 44 formed in a contact surface (contact portion) thereof disposed in contact with the outer peripheral portion 25b; the material of the focus ring 30 is selected as appropriate in accordance with the type of the film to be etched of the wafer W, for example silicon (Si) can be used in the case that the film to be etched of the wafer W is an oxide film, and silicon dioxide ($SiO_2$) can be used in the case that the film to be etched of the wafer W is a polysilicon film. Silicon nitride (SiN), alumite-treated aluminum (Al), silicon carbide (SiC), and so on can also be used.

Figure 7B:
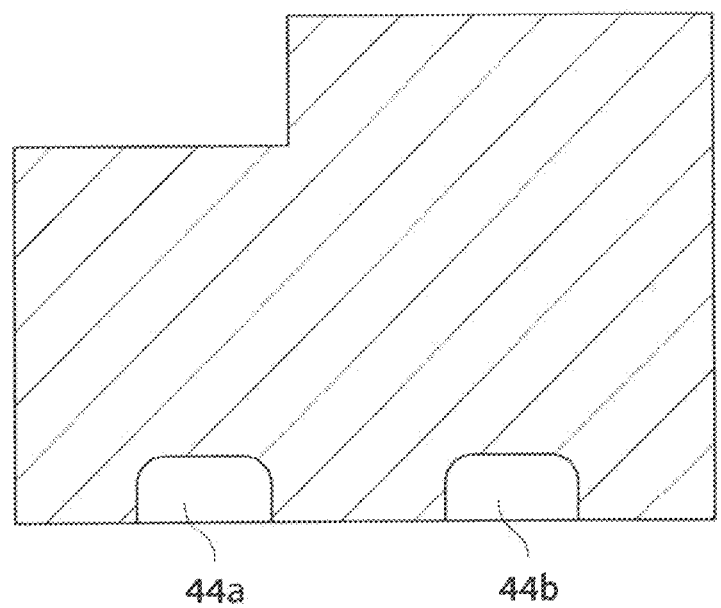

FIGS. 7A and 7B are schematic views showing the construction of the heat transfer gas introduction groove 44 appearing in FIG. 6; specifically, FIG. 7A is a view showing the focus ring 30 as viewed from the contact surface, and FIG. 7B is a sectional view taken along line III-III in FIG. 7A.

As shown in FIGS. 7A and 7B, the heat transfer gas introduction groove 44 has formed in the contact surface an inner introduction groove 44a that has an annular shape concentric with the focus ring 30, an outer introduction groove 44b that has an annular shape concentric with the focus ring 30 and is disposed so as to surround the inner introduction groove 44a, and radial introduction grooves 44c that join the inner introduction groove 44a and the outer introduction groove 44b together; the diameter of the outer introduction groove 44b is approximately equal to the distance between the two openings of the focus ring section line 46b in the upper surface of the outer peripheral portion 25b.

In general, the center of the focus ring 30 coincides with the center of the central portion 25a of the electrostatic chuck 25, and hence when the focus ring 30 is mounted on the upper surface of the outer peripheral portion 25b, the openings of the focus ring section line 46b face the outer introduction groove 44b, whereby He gas supplied from the openings of the focus ring section line 46b is filled into the heat transfer gas introduction groove 44.

Moreover, the inner introduction groove 44a, the outer introduction groove 44b and the radial introduction grooves 44c have a substantially rectangular cross-sectional shape, a width of, for example, 1 mm, and a depth of 0.1 to 1.0 mm, preferably at least 0.5 mm, and moreover have corners thereof rounded off.

Next, a description will be given of changing of the supply pressure of He gas into the heat transfer gas introduction groove 44 (hereinafter referred to as the "He pressure"), and the high voltage applied to the electrode plate 25d to attract the focus ring 30 to the outer peripheral portion 25b of the electrostatic chuck 25 (hereinafter referred to as the "F/R chuck voltage") during dry etching processing.

Figures 8, 8A:
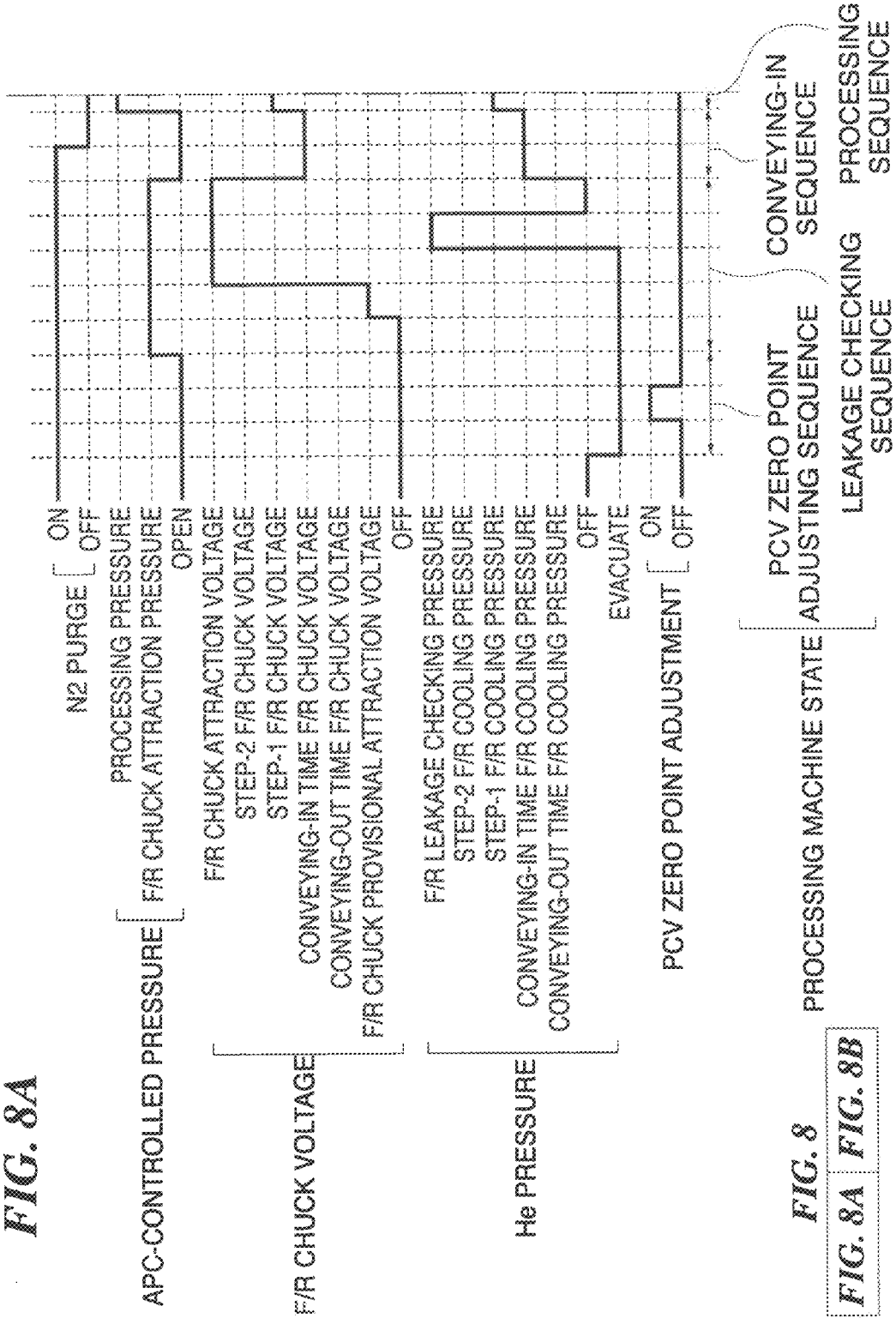
FIGS. 8A and 8B are sequence diagrams showing changes in He pressure and F/R chuck voltage during continuous dry etching processing.
Figure 8B:
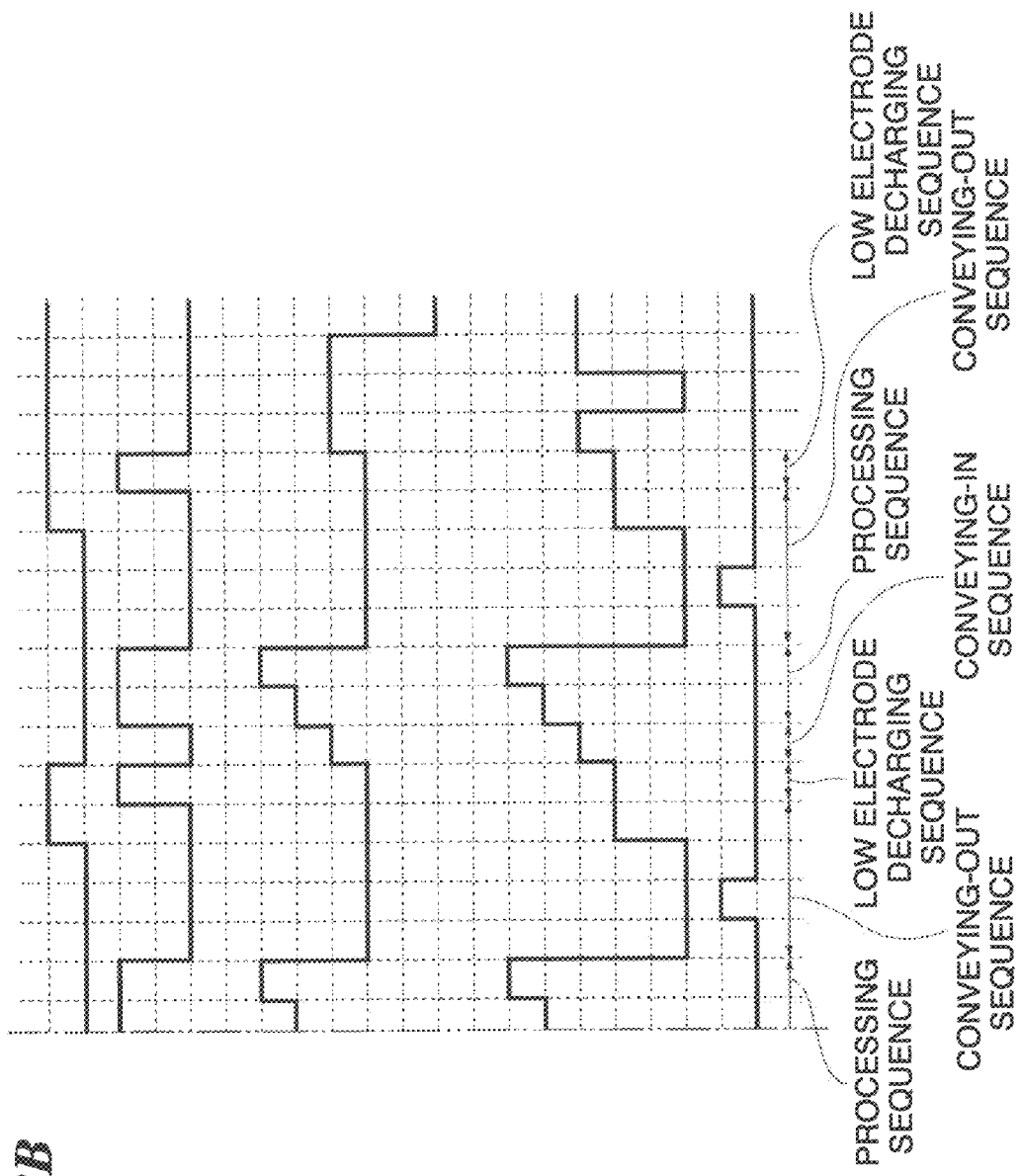

FIGS. 8A and 8B are sequence diagrams showing changes in the He pressure and the F/R chuck voltage during continuous dry etching processing.

In FIGS. 8A and 8B, the continuous dry etching processing is comprised of a PCV zero point adjusting sequence in which adjustment of the zero point of the PCV 82 is carried out, a leakage checking sequence in which leakage of the He gas supplied into the heat transfer gas introduction groove 44 is checked for, a conveying-in sequence in which a wafer W is conveyed into the chamber 10, a processing sequence in which the wafer W that has been conveyed in is subjected to dry etching, a conveying-out sequence in which the wafer W that has been subjected to the dry etching is conveyed out from the chamber 10, and a lower electrode decharging sequence in which the lower electrode 11, which has become charged during the dry etching, is decharged; the continuous dry etching processing is carried out through a suitable combination of these sequences.

First, $N_2$ gas is introduced into the chamber 10 ($N_2$ purge on), and the APC is opened and the exhauster 18 is operated, thus reducing the pressure inside the chamber 10.

Next, in the PCV zero point adjusting sequence, the PCV 82 is closed, thus closing off the focus ring section line 46b from the heat transfer gas supply unit 35, and the opening/closing valves 83, 86 and 87 are opened. The focus ring section line 46b is thus evacuated by the exhauster 18 via the chamber release system 84. The evacuation is continued for a predetermined time period, and then the adjustment of the zero point of the PCV 82 is carried out based on the pressure inside the focus ring section line 46b (PCV zero point adjustment on). By carrying out such adjustment of the zero point of the PCV 82 at the start of the continuous dry etching processing, the He pressure can be controlled accurately in the subsequent sequences. Moreover, when reducing the pressure inside the chamber 10, by evacuating the focus ring section line 46b, a pressure difference between the interior of the chamber 10 and the interior of the heat transfer gas introduction groove 44 can be eliminated. As a result, the focus ring 30 can be prevented from separating away due to such a pressure difference.

Next, in the leakage checking sequence, the APC is closed, thus raising the pressure inside the chamber 10 controlled by the APC (hereinafter referred to as the "APC-controlled pressure"), whereby the APC-controlled pressure is set to an F/R chuck attraction pressure, which is the pressure inside the chamber 10 when checking for leakage. When the APC-controlled pressure is rising, once the APC-controlled pressure reaches $6.65 \times 10^4$ Pa (500 torr), a high voltage is applied to the electrode plate 25d, whereby the F/R chuck voltage is set to an F/R chuck provisional attraction voltage for provisional attraction, and then after the lapse of 2.5 seconds, the F/R chuck voltage is set to an F/R chuck attraction voltage for main attraction. The reason that the application of the high voltage to the electrode plate 25d is not commenced until the APC-controlled pressure has reached $6.65 \times 10^4$ Pa is that when the pressure inside the chamber 10 is low, the focus ring 30 will not be attracted to the electrostatic chuck 25 even if a high voltage is applied to the electrode plate 25d.

He gas is then supplied into the heat transfer gas introduction groove 44 from the focus ring section line 46b, and once the He pressure has reached an F/R leakage checking pressure, the PCV 82 is closed (the He pressure is put into an "off" state), and after a predetermined time period has passed, the pressure inside the focus ring section line 46b is measured, and it is determined whether or not the measured pressure is within a predetermined range. Note that the leakage checking may alternatively be carried out not by measuring the pressure inside the focus ring section line 46b, but rather by measuring the gas flow rate inside the focus ring section line 46b.

If the measured pressure is within the predetermined range, then next, in the conveying-in sequence, the APC is opened, and at the same time the F/R chuck voltage is set to a conveying-in time F/R chuck voltage, and the He pressure is set to a conveying-in time F/R cooling pressure. Once the He pressure is stable, a wafer W is conveyed into the chamber 10, and is mounted on and attracted to the electrostatic chuck 25, and the introduction of $N_2$ gas into the chamber 10 is suspended ($N_2$ purge off).

Next, in the processing sequence, the APC is closed, thus raising the APC-controlled pressure to a processing pressure, which is the pressure inside the chamber 10 required for the dry etching, and the dry etching is commenced, and then in accordance with the respective steps in a recipe for the dry etching, the He pressure is, for example, changed to a step-1 F/R cooling pressure, a step-2 F/R cooling pressure and so on, and at the same time the F/R chuck voltage is, for example, changed to a step-1 F/R chuck voltage, a step-2 F/R chuck voltage and so on. The values of the step-1 F/R cooling pressure and the step-1 F/R chuck voltage and so on are set in advance such that the temperature of the focus ring 30 will remain constant even when the high-frequency voltage applied to the lower electrode 11 and the high voltage applied to the electrode plate 25c are changed from step to step. According to the plasma processing apparatus according to the present third embodiment, the step-n F/R cooling pressure and the step-n F/R chuck voltage can each be set for 24 steps.

After the dry etching has been completed, in the conveying-out sequence, the APC is opened, the F/R chuck voltage is set to a conveying-out time F/R chuck voltage, and, as in the PCV zero point adjusting sequence described above, the PCV 82 is closed, and the opening/closing valves 83, 86 and 87 are opened, and adjustment of the zero point of the PCV 82 is carried out (PCV zero point adjustment on). After that, $N_2$ gas is introduced into the chamber 10 ($N_2$ purge on), and the He pressure is set to a conveying-out time F/R cooling pressure, and the wafer W that has been subjected to the dry etching is conveyed out from the chamber 10.

After the wafer W has been conveyed out, in the lower electrode decharging sequence, the APC is closed, thus setting the APC-controlled pressure to the processing pressure, and decharging of the lower electrode 11 is carried out. Then, in the following conveying-in sequence, the APC is opened, and the F/R chuck voltage is set to the conveying-in time F/R chuck voltage, the He pressure is set to the conveying-in time F/R cooling pressure, and the introduction of $N_2$ gas into the chamber 10 is suspended ($N_2$ purge off). The next wafer W (i.e. a second wafer W) is then conveyed into the chamber 10, and is mounted on and attracted to the electrostatic chuck 25.

Next, the processing sequence and the conveying-out sequence are carried out as described above, and after the second wafer W has been subjected to the dry etching and has been conveyed out, the lower electrode decharging sequence is carried out as described above.

The above conveying-in sequence, processing sequence, conveying-out sequence and lower electrode decharging sequence are carried out repeatedly in accordance with the number of wafers W in one lot, for example 25.

The reason for not setting the F/R chuck voltage and the He pressure to zero but rather carrying out cooling of the focus ring 30 during the conveying-out sequence and the conveying-in sequence is to prepare for the dry etching of the next wafer W, i.e. to completely remove the heat from the focus ring 30, and thus make the dry etching conditions uniform for all of the wafers W.

Moreover, adjustment of the zero point of the PCV 82 is always carried out in every conveying-in sequence, i.e. adjustment of the zero point of the PCV 82 is always carried out for every processing sequence. As a result, the He pressure can be controlled accurately in every processing sequence.

After the lower electrode decharging sequence has been carried out for the final time in the lot, the APC is opened, and the F/R chuck voltage is set to the conveying-in time F/R chuck voltage, and the He pressure is set to the conveying-in time F/R cooling pressure; then, after a predetermined time period has passed, the PCV 82 is closed, and the opening/closing valves 83, 86 and 87 are opened, thus carrying out evacuation of the focus ring section line 46b. After the He gas has been removed from the focus ring section line 46b, the He pressure is once again set to the conveying-in time F/R cooling pressure, and furthermore the F/R chuck voltage is set to zero, thus releasing the electrostatic attraction of the focus ring 30 onto the electrostatic chuck 25.

It should be noted that the rises and falls in the graphs of the F/R chuck voltage and the He pressure in the sequence diagrams of FIGS. 8A and 8B merely show where the values of the F/R chuck voltage and the He pressure change, and do not show the magnitudes of the values.

According to the sequence of FIGS. 8A and 8B, the set values of the F/R chuck voltage and the He pressure are changed for the conveying-in sequence, the processing sequence and the conveying-out sequence, and in particular are changed for each step of the processing sequence, and hence the cooling of the focus ring 30 can be carried out stably. The occurrence of local deterioration of the etching characteristics of the wafer W can thus be prevented.

According to the susceptor of the third embodiment, the focus ring 30 has a heat transfer gas introduction groove 44 formed in the contact surface thereof disposed in contact with the outer peripheral portion 25b of the electrostatic chuck 25, and when the focus ring 30 has been mounted on the upper surface of the outer peripheral portion 25b, the openings of the focus ring section line 46b face the heat transfer gas introduction groove 44, and hence He gas from the focus ring section line 46b is filled into the heat transfer gas introduction groove 44; consequently, a cooling unit is not required between the electrostatic chuck 25 and the focus ring 30, and moreover the He gas can be made to diffuse reliably between the electrostatic chuck 25 and the focus ring 30, and furthermore the area of contact between the focus ring 30 and the He gas can be increased. The heat transfer ability between the electrostatic chuck 25 and the focus ring 30 can thus be improved sufficiently, whereby the efficiency of cooling of the focus ring 30 can be greatly improved, while preventing an increase in the cost of the plasma processing apparatus. Moreover, the heat transfer gas introduction groove 44 causes a suitable reduction in the rigidity of the focus ring 30, whereby the focus ring 30 can be deformed to follow the shape of the electrostatic chuck 25, whereby the degree of close contact between the electrostatic chuck 25 and the focus ring 30 can be improved. As a result, the efficiency of cooling of the focus ring 30 can be improved yet more greatly.

Moreover, the depth of the heat transfer gas introduction groove 44 is at least 0.1 mm, and hence the conductance can be made large, and thus the He gas can be filled into the heat transfer gas introduction groove 44 rapidly, whereby the efficiency of cooling of the focus ring 30 can be improved markedly.

Furthermore, corners of the heat transfer gas introduction groove 44 are rounded off, and hence the occurrence of cracks in the heat transfer gas introduction groove 44 can be prevented, and thus the durability of the focus ring 30 can be improved, whereby an increase in the maintenance cost can be prevented.

Moreover, the heat transfer gas introduction groove 44 has formed in the contact surface an inner introduction groove 44a that has an annular shape concentric with the focus ring 30, an outer introduction groove 44b that has an annular shape concentric with the focus ring 30 and is disposed so as to surround the inner introduction groove 44a, and radial introduction grooves 44c that join the inner introduction groove 44a and the outer introduction groove 44b together; as a result, the He gas can be made to diffuse uniformly between the electrostatic chuck 25 and the focus ring 30 (i.e. over the contact surface), and hence the focus ring 30 can be cooled uniformly.

According to the susceptor of the third embodiment described above, the heat transfer gas introduction groove 44 has two annular sections in the contact surface; however, the structure of the heat transfer gas introduction groove 44 is not limited to this, and may be changed as appropriate in accordance with the size and rigidity of the focus ring 30, having, for example, a single annular section, or three or more annular sections.

Moreover, the heat transfer gas introduction groove 44 need not have the radial introduction grooves 44c; in the case that the heat transfer gas introduction groove 44 does not have radial introduction grooves 44c, openings of the gas supply line 46 facing the inner introduction groove 44a are preferably disposed in the upper surface of the outer peripheral portion 25b.

Moreover, the number of openings of the focus ring section line 46b is not limited to being two, but rather openings of the focus ring section line 46b may be disposed in three or more places in the upper surface of the outer peripheral portion 25b.

Next, a susceptor according to a fourth embodiment of the present invention will be described in detail.

The susceptor according to the fourth embodiment has basically the same construction and operation as in the third embodiment described above, and hence description of aspects of the construction and operation that overlap with the third embodiment will be omitted, and in the following only aspects of the construction and operation that differ to the third embodiment will be described.

Figure 9:
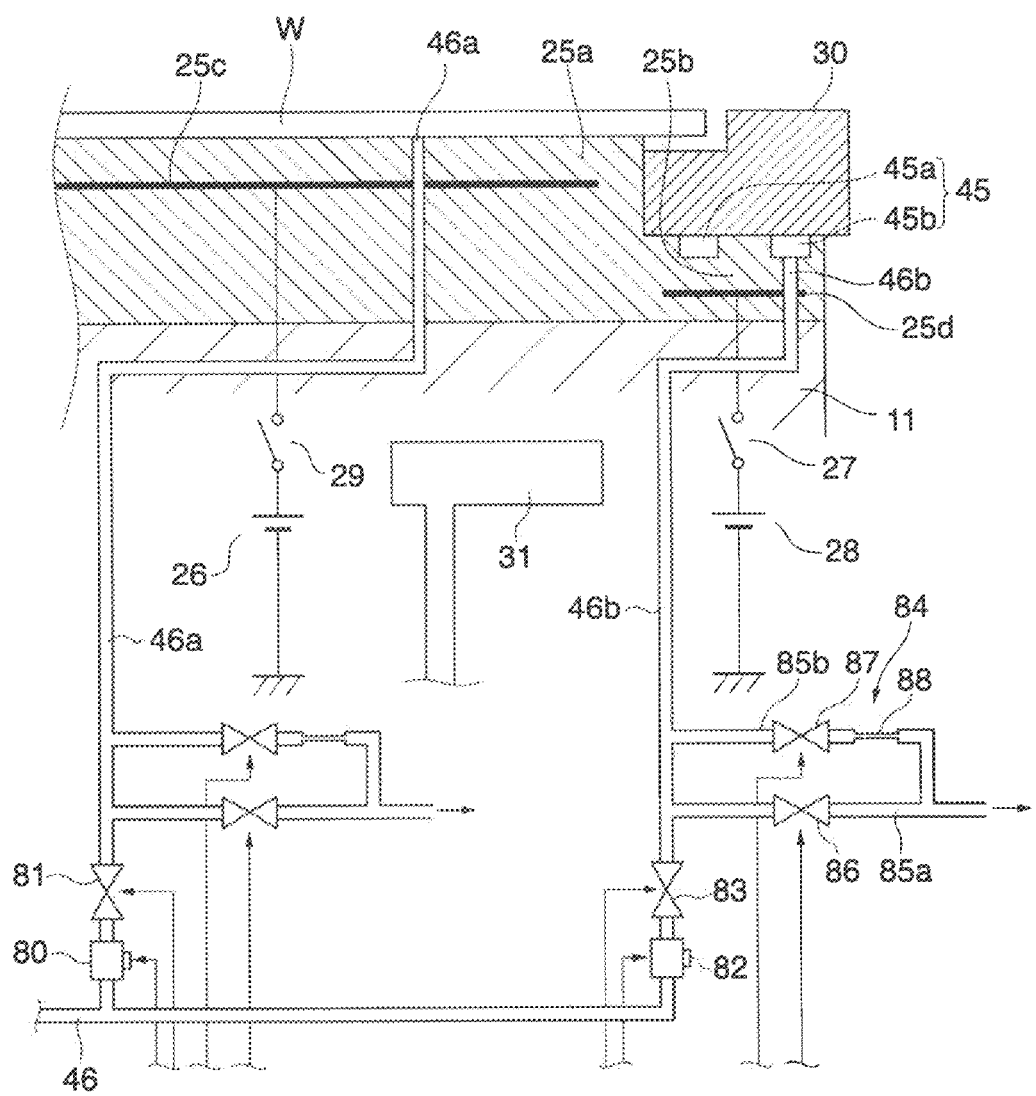
FIG. 9 is a schematic sectional view showing the construction of a susceptor according to a fourth embodiment of the present invention.

FIG. 9 is a schematic sectional view showing the construction of the susceptor according to the fourth embodiment.

As shown in FIG. 9, the susceptor according to the fourth embodiment is again comprised of a lower electrode 11, an electrostatic chuck 25 disposed on an upper surface of the lower electrode 11, and a focus ring 30 mounted on an upper surface of an outer peripheral portion 25b of the electrostatic chuck 25.

Here, the electrostatic chuck 25 has a heat transfer gas introduction groove 45 formed in the upper surface of the outer peripheral portion 25b; the heat transfer gas introduction groove 45 has formed in the upper surface of the outer peripheral portion 25b an inner introduction groove 45a that has an annular shape concentric with the central portion 25a, an outer introduction groove 45b that has an annular shape concentric with the central portion 25a and is disposed so as to surround the inner introduction groove 45a, and radial introduction grooves (not shown) that join the inner introduction groove 45a and the outer introduction groove 45b together; a focus ring section line 46b of a gas supply line 46 is joined to the outer introduction groove 45b. As a result, He gas supplied from the openings of the focus ring section line 46b is filled into the heat transfer gas introduction groove 45.

In general, the center of the focus ring 30 coincides with the center of the central portion 25a of the electrostatic chuck 25, and hence when the focus ring 30 is mounted on the upper surface of the outer peripheral portion 25b, the inner introduction groove 45a and the outer introduction groove 45b are disposed concentrically with the focus ring 30.

Moreover, the inner introduction groove 45a, the outer introduction groove 45b and the radial introduction grooves have a substantially rectangular cross-sectional shape, a width of, for example, 1 mm, and a depth of 0.1 to 1.0 mm, preferably at least 0.5 mm, and moreover have corners thereof rounded off.

According to the susceptor of the fourth embodiment, the electrostatic chuck 25 has a heat transfer gas introduction groove 45 formed in the upper surface of the outer peripheral portion 25b, and the focus ring section line 46b of the gas supply line 46 is joined to the outer introduction groove 45b and thus supplies He gas into the heat transfer gas introduction groove 45; consequently, a cooling unit is not required between the electrostatic chuck 25 and the focus ring 30, and the need to form a heat transfer gas introduction groove in the focus ring 30 can be eliminated, and moreover the He gas can be made to diffuse reliably between the electrostatic chuck 25 and the focus ring 30. The heat transfer ability between the electrostatic chuck 25 and the focus ring 30 can thus be improved sufficiently, whereby the efficiency of cooling of the focus ring 30 can be greatly improved, while reducing the initial cost of the plasma processing apparatus.

Moreover, the heat transfer gas introduction groove 45 has formed in the upper surface of the outer peripheral portion 25b an inner introduction groove 45a that has an annular shape concentric with the central portion 25a, an outer introduction groove 45b that has an annular shape concentric with the central portion 25a and is disposed so as to surround the inner introduction groove 45a, and radial introduction grooves that join the inner introduction groove 45a and the outer introduction groove 45b together; as a result, the He gas can be made to diffuse uniformly over the upper surface of the outer peripheral portion 25b, which is the contact surface between the outer peripheral portion 25b and the focus ring 30, and hence the focus ring 30 can be cooled uniformly.

According to the susceptor of the fourth embodiment described above, the heat transfer gas introduction groove 45 has two annular sections in the upper surface of the outer peripheral portion 25b; however, the structure of the heat transfer gas introduction groove 45 is not limited to this, and may be changed as appropriate in accordance with the size of the focus ring 30, having, for example, a single annular section, or three or more annular sections.

Moreover, according to the susceptors of the third and fourth embodiments described above, only one of the focus ring 30 and the electrostatic chuck 25 has a heat transfer gas introduction groove, but the focus ring 30 and the electrostatic chuck 25 may each have a heat transfer gas introduction groove, whereby the efficiency of cooling of the focus ring 30 can be further improved.

In dry etching processing, out of radicals generated from the processing gas, depositable radicals that will attach to objects tend to attach to low-temperature objects. With the conventional plasma processing apparatus, in the dry etching processing, the temperature of the wafer W rises only to approximately 80° C. due to the cooling action of a cooling mechanism built into the lower electrode or the like. On the other hand, the temperature of the focus ring rises to approximately 200 to 400° C. due to colliding radicals. Depositable radicals thus tend to attach to the wafer W, and in particular readily attach to a rear surface of a portion of the wafer W that projects out from the electrostatic chuck, i.e. a wafer beveled portion.

Depositable radicals attached to the wafer beveled portion may detach from the wafer W when the wafer W is taken out from the plasma processing apparatus after the dry etching processing has been carried out on the wafer W. The detached depositable radicals will remain inside the plasma processing apparatus, and during the next and subsequent times the dry etching processing is carried out, will be flung around by the flow of the $N_2$ gas. The flung around depositable radicals may become attached to the surface of a wafer W, thus causing particle contamination.

To prevent the occurrence of such particle contamination, it is preferable to make it such that depositable radicals are not attached to the wafer beveled portion. As a method of preventing attachment of depositable radicals to the wafer beveled portion, one can envisage, for example, making $O_2$ gas or He gas flow between the focus ring and the electrostatic chuck, thus generating a gas flow in the vicinity of the surface of the wafer beveled portion. However, the gas flow will also sweep away etching radicals, and hence it will not be possible to maintain the uniformity of the etching at an edge part of the wafer W.

On the other hand, with the susceptors according to the third and fourth embodiments described above, by filling a coolant such as a GALDEN™ fluid (fluorinated fluid) into the heat transfer gas introduction groove 44 or 45, the focus ring 30 is cooled, and hence depositable radicals are forcibly attached to the focus ring 30. As a result, the depositable radicals can be prevented from becoming attached to the wafer beveled portion, and hence the occurrence of particle contamination can be prevented. There are no particular limitations on the type of the coolant filled into the heat transfer gas introduction groove 44 or 45 to cool the focus ring 30, but GALDEN™ fluids (fluorinated fluids) are readily procurable, and hence if a GALDEN™ (fluorinated fluid) fluid is used, then the running cost for the plasma processing apparatus can be reliably kept down.

When cooling the focus ring 30, it is preferable to reduce the temperature of the focus ring 30 to at least 20° C. below the temperature of the electrostatic chuck 25. Even during the dry etching processing, the temperature of the electrostatic chuck 25 is maintained at approximately 20° C. by the coolant chamber 31 inside the lower electrode 11. Upon reducing the temperature of the focus ring 30 to at least 20° C. below the temperature of the electrostatic chuck 25, the temperature of the focus ring 30 will thus be reduced to not more than 0° C. As a result, depositable radicals can be reliably attached to the focus ring 30.

In the case that depositable radicals have become attached in a large amount to the focus ring 30, it will be necessary to replace the focus ring 30, but frequent replacement of the focus ring 30 will result in an increase in the maintenance cost for the plasma processing apparatus, and hence it is necessary to make it such that depositable radicals are not attached to the focus ring 30 in a large amount. It is thus preferable to remove depositable radicals that have become attached to the focus ring 30.

With the susceptors according to the third and fourth embodiments described above, the focus ring 30 is thus heated by filling a high-temperature medium into the heat transfer gas introduction groove 44 or 45. The depositable radicals are sublimed by the high temperature, and hence by heating the focus ring 30, the attached depositable radicals can be removed. As a result, the focus ring 30 replacement cycle can be lengthened, and hence the maintenance cost for the plasma processing apparatus can be kept down.

The method of heating the focus ring is not limited to filling with a high-temperature heat transfer medium. For example, the focus ring may be heated by a heating member (second heating means) that covers an outer peripheral surface of the focus ring.

Figure 10:
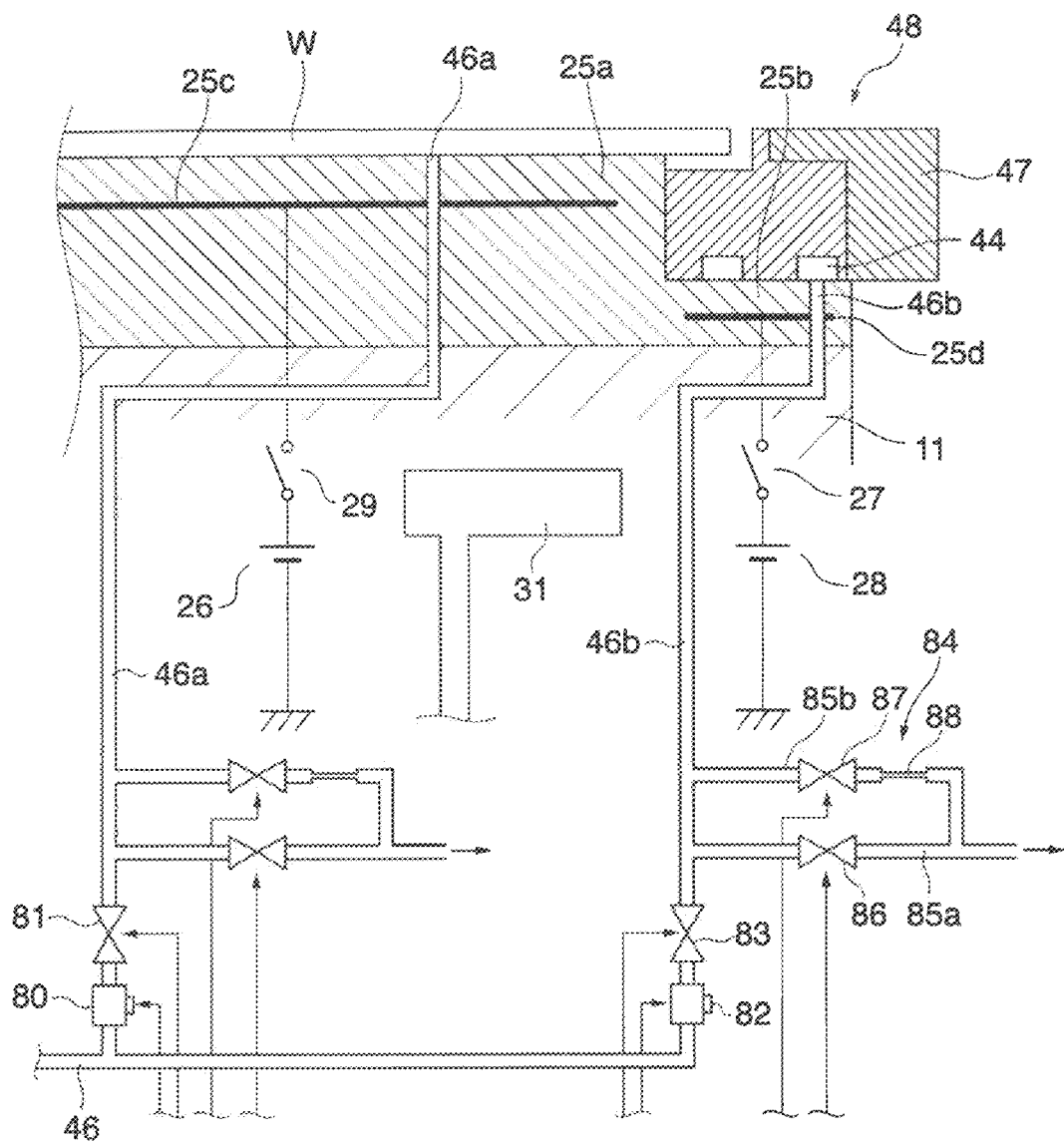
FIG. 10 is a schematic sectional view showing the construction of a heating member that heats a focus ring, and the heated focus ring.

FIG. 10 is a schematic sectional view showing the construction of a heating member that heats a focus ring, and the heated focus ring.

In FIG. 10, the outside radius of the focus ring 48 is set to be smaller than that of the focus ring 30 described earlier, and an upper surface of the focus ring 48 is made to be stepped such that an outer peripheral side of the upper surface is lowered. The heating member 47 is an annular member having an inverted L-shaped cross section; an inner peripheral surface of the heating member 47 covers the outer peripheral surface of the focus ring 48, and moreover a projecting portion of the L shape loosely fits into the stepped portion of the upper surface of the focus ring 48. The heating member 47 is made of silicon (Si), silicon carbide (SiC), silicon dioxide ($SiO_2$) or the like, for which the temperature readily rises upon being subjected to collision by radicals.

A plasma is generated inside the plasma processing apparatus, whereby radicals are caused to collide with the heating member 47, thus raising the temperature of the heating member 47. The heated heating member 47 transfers its heat to the focus ring 48, thus heating the focus ring 48.

By using the heating member 47, the necessity of filling a high-temperature medium into the heat transfer gas introduction groove 44 or 45 can be eliminated, and hence the structures of the heat transfer gas introduction groove 44 or 45, the gas supply line 46 and the heat transfer gas supply unit 35 can be simplified.

The removal of depositable radicals may be realized not only by heating the focus ring, but also by another method.

For example, depositable radicals may be removed by making a cleaning gas flow into the plasma processing apparatus. Specifically, a plasma is generated from a cleaning gas comprised of $O_2$, $NF_3$, $SF_6$, $CF_4$ or the like, and hence radicals thus generated are caused to collide with the depositable radicals attached to the focus ring, thus scattering the depositable radicals, whereby the depositable radicals can easily be removed from the focus ring.

Moreover, the depositable radicals may be removed by, for example, exposing the focus ring to the plasma generated during the dry etching processing. Specifically, radicals generated from the processing gas are caused to collide with the depositable radicals attached to the focus ring. As a result, the deposit attached to the focus ring 30 can be removed during the continuous dry etching processing. The deposit can thus be removed without reducing the efficiency of the dry etching processing of the wafers W.

Figure 11:
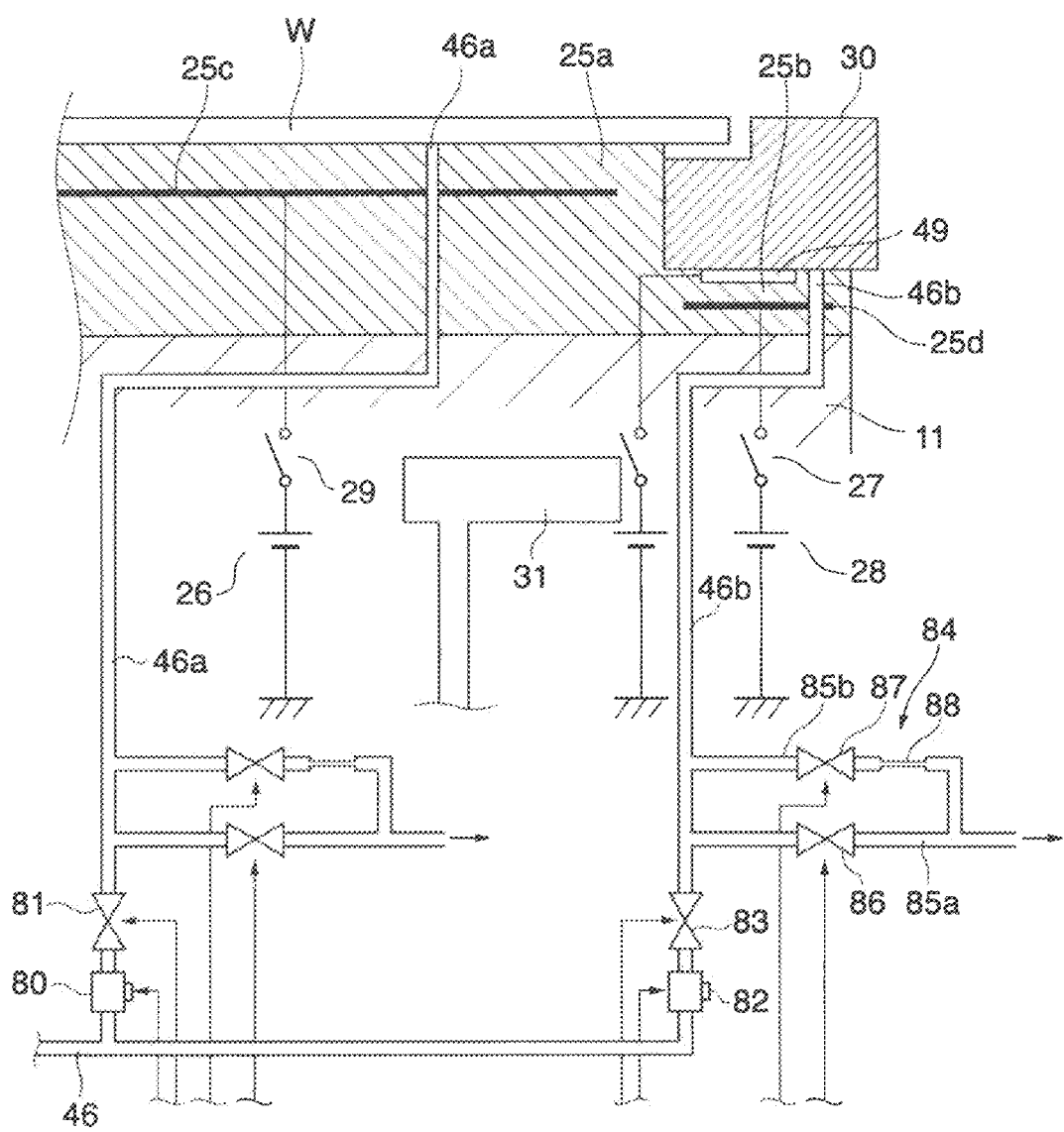
FIG. 11 is a schematic sectional view showing the construction of a susceptor having a Peltier device provided therein.

The methods of cooling and heating the focus ring are not limited to methods using a heat transfer medium as described above. For example, as shown in FIG. 11, instead of the heat transfer gas introduction groove 44 or 45, a Peltier device 49 may be provided at the contact surface between the focus ring 30 and the electrostatic chuck 25. With the Peltier device 49, heating or cooling can easily be carried out using a DC current, and hence a heat transfer medium is not required. The structure of the heat exchange mechanism can thus be simplified, and hence the initial cost for the plasma processing apparatus can be reduced. The Peltier device 49 may be provided on either the focus ring 30 or the electrostatic chuck 25.

Furthermore, as methods of heating the focus ring, in addition to the methods described above, heating using irradiation from a lamp, or heating using heat generation by a resistor may be used.

There are no limitations on the combination of the methods of heating and cooling the focus ring described above; these methods can be used combined as appropriate.

According to the susceptors of the first to fourth embodiments, the electrostatic chuck 25 is disk-shaped, and the focus ring 30 is annular in shape, but the shapes of the electrostatic chuck 25 and the focus ring 30 are not limited to these shapes; for example, in the case that the objects to be processed are LCDs or the like, in accordance with the shape of the LCDs, the electrostatic chuck 25 may have a square plate shape, and the focus ring 30 may have a square frame shape.

Next, a susceptor according to a fifth embodiment of the present invention will be described in detail.

Figure 12:
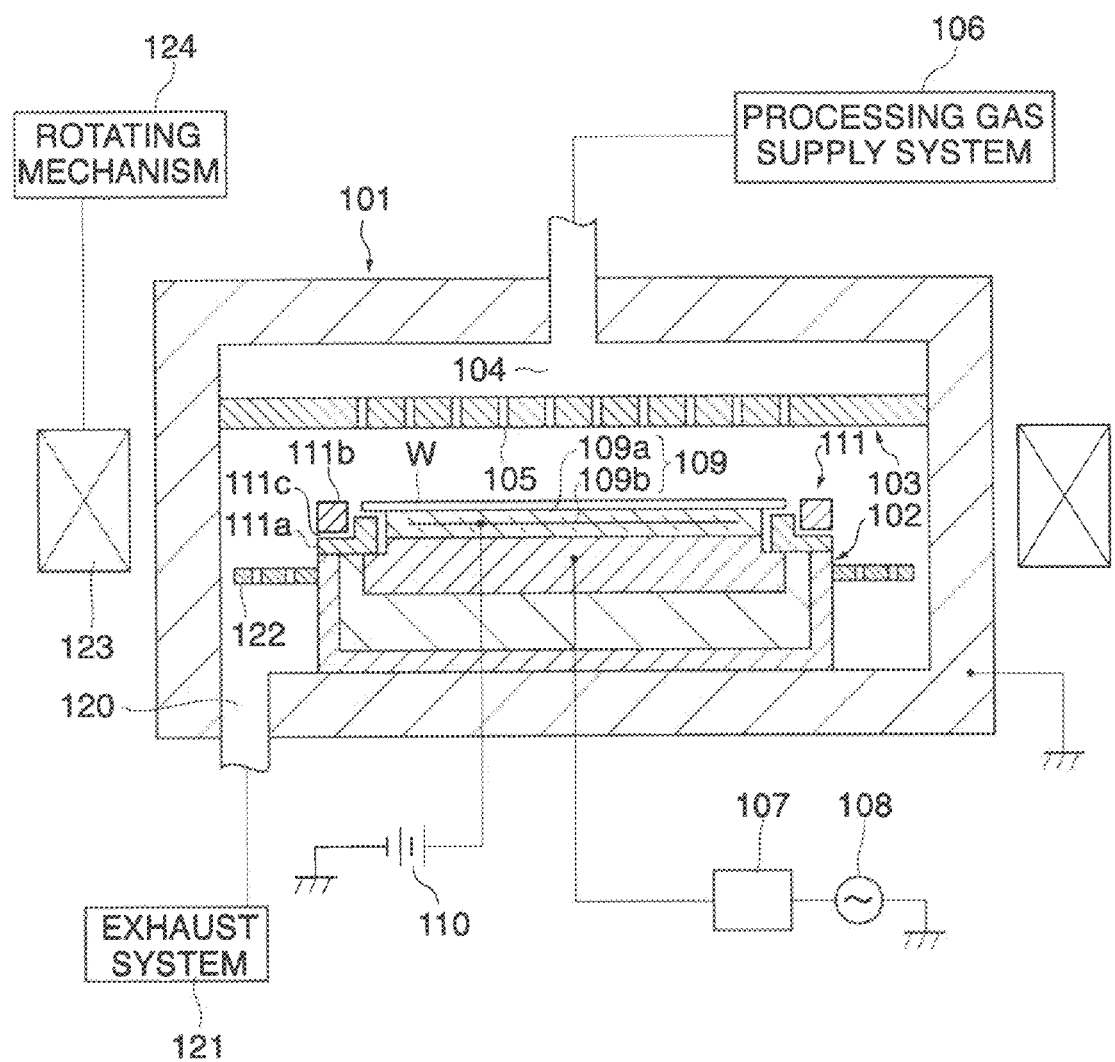
FIG. 12 is a schematic sectional view showing the construction of a plasma processing apparatus in which can be used a susceptor according to a fifth embodiment of the present invention.

FIG. 12 is a schematic sectional view showing the construction of a plasma processing apparatus in which can be used the susceptor according to the fifth embodiment.

In FIG. 12, a vacuum chamber 101 that forms a processing vessel is made, for example, of aluminum or the like, and is formed in a cylindrical shape.

The vacuum chamber 101 has provided therein an susceptor 102 for mounting a wafer W, and this susceptor 102 also acts as a lower electrode. Moreover, a shower head 103 that also acts as an upper electrode is provided in a ceiling portion of the vacuum chamber 101; the susceptor 102 and the shower head 103 together constitute a pair of parallel plate electrodes.

A gas diffusion cavity 104 is provided above the shower head 103, and moreover a large number of small holes 105 are provided in the shower head 103, which are positioned below the gas diffusion cavity 104. Moreover, the shower head 103 is constructed such that a predetermined processing gas (etching gas) supplied from a processing gas supply system 106 diffuses through the gas diffusion cavity 104, and is supplied from the small holes 105 in the form of a shower toward the wafer W. In the present embodiment, the shower head 103 is made to be at a ground potential, but a construction may be adopted in which a high-frequency power source is connected to the shower head 103, and high-frequency voltages are applied to both the susceptor 102 and the shower head 103.

A high-frequency power source 108 is connected to the susceptor 102 via a matching unit 107, and high-frequency electrical power at a predetermined high frequency (e.g. a frequency of from approximately several hundred kHz to approximately one hundred MHz) is supplied to the susceptor 102.

Moreover, an electrostatic chuck 109 for attracting and holding the wafer W is provided on a wafer W mounting surface of the susceptor 102. The electrostatic chuck 109 has a construction in which an electrostatic chuck electrode 109b is provided in an insulating layer 109a, and a DC power source 110 is connected to the electrostatic chuck electrode 109b. Furthermore, a focus ring 111 is provided on an upper surface of the susceptor 102 so as to surround the wafer W.

Figure 13:
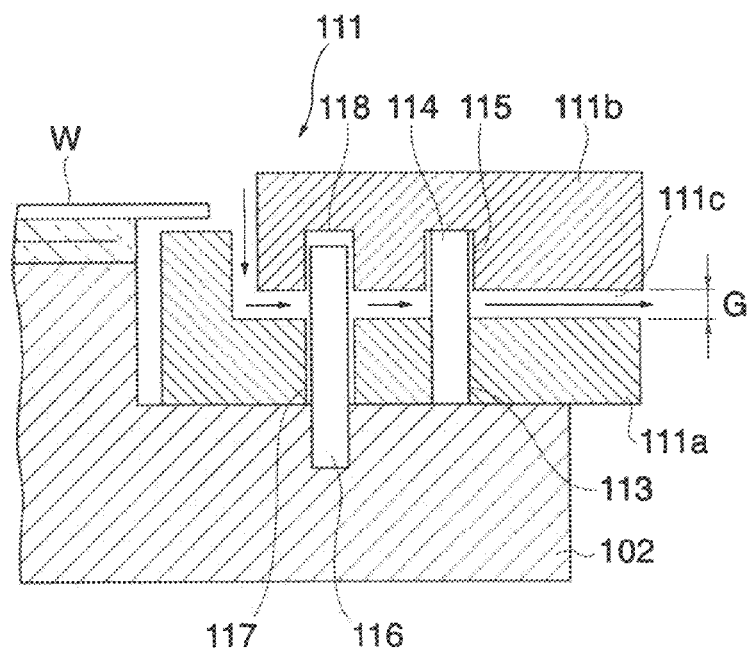
FIG. 13 is a schematic sectional view showing the construction of essential parts of the plasma processing apparatus shown in FIG. 12.

The focus ring 111 is constructed such as to have an annular shape overall, but as shown in FIG. 12 and also in more detail in FIG. 13, is comprised of a lower member 111a that is mounted on the susceptor 102, and an upper member 111b that is disposed above the lower member 111a.

The lower member 111a and the upper member 111b are each made of, for example, silicon or the like, and constructed in an annular shape. Moreover, a gap 111c is formed between the lower member 111a and the upper member 111b, and as shown by arrows in FIG. 13, the gap 111c acts as a flow path for the processing gas.

A plurality of pin insertion holes 113 (in the present embodiment, a total of three at 120° intervals along a circumferential direction) are provided in the lower member 111a, and a pin 114 is inserted into each of the pin insertion holes 113. Moreover, fixing holes 115 are provided in the upper member 111b in correspondence with the pins 114, and the upper member 111b is supported on the pins 114 in a state in which a tip portion of each pin 114 is inserted into the corresponding fixing hole 115. The upper member 111b is thus substantially mounted on the pins 114, and hence the structure is such that the upper member 111b can be detached from the lower member 111a by being lifted up, whereby it is possible to replace only the upper member 111b.

Moreover, the pins 114 are detachable from the lower member 111a, and by replacing the pins 114 with ones of a different length, the width of the gap 111c between the lower member 111a and the upper member 111b (the gap width G shown in FIG. 13) can be changed.

Reference numeral 116 in FIG. 13 represents a positioning pin for positioning the focus ring 111 in a predetermined position on the susceptor 102; a total of two such positioning pins 116 are provided separated from one another by 180° in the circumferential direction on the susceptor 102. Moreover, positioning holes 117 and 118 are provided in the lower member 111a and the upper member 111b respectively in correspondence with the positioning pins 116.

Moreover, a coolant flow path for coolant circulation, not shown, is formed in the susceptor 102, whereby the temperature of the susceptor 102 can be controlled to a predetermined temperature. Moreover, a gas supply mechanism, not shown, that supplies a cooling gas, for example helium gas, between the susceptor 102 and a rear surface of the wafer W is provided, and through this cooling gas, heat exchange between the susceptor 102 and the wafer W is promoted, and hence the temperature of the wafer W can be controlled to a predetermined temperature.

As shown in FIG. 12, an exhaust port 120 is provided in a base of the vacuum chamber 101, and an exhaust system 121 comprised of a vacuum pump or the like is connected to the exhaust port 120.

Moreover, an exhaust ring 122 formed in an annular shape is provided around the susceptor 102 in a manner extending substantially parallel with the wafer W mounting surface. Exhaust paths comprised of a large number of holes are formed in the exhaust ring 122, and by carrying out evacuation using the exhaust system 121 via these exhaust paths, a uniform processing gas flow is formed around the susceptor 102. Moreover, the exhaust ring 122 is electrically connected to a ground potential, and hence a plasma formed in a processing space between the susceptor 102 and the shower head 103 is prevented from leaking out into a space below the exhaust ring 122.

Moreover, a magnetic field-forming mechanism 123 is provided around the vacuum chamber 101, whereby a desired magnetic field can be formed in the processing space inside the vacuum chamber 101. A rotating mechanism 124 is provided for the magnetic field-forming mechanism 123, whereby the magnetic field inside the vacuum chamber 101 can be rotated by rotating the magnetic field-forming mechanism 123 around the vacuum chamber 101.

Next, a description will be given of plasma etching processing carried out using the plasma etching apparatus constructed as described above.

First, a gate valve, not shown, provided in a conveying in/out port, not shown, of the vacuum chamber 101 is opened, and a wafer W is conveyed into the vacuum chamber 101 using a conveyance mechanism or the like, and mounted on the susceptor 102. The wafer W mounted on the susceptor 102 is then attracted and held by applying a predetermined DC voltage from the DC power source 110 to the electrostatic chuck electrode 109b of the electrostatic chuck 109

Next, the conveyance mechanism is withdrawn from the vacuum chamber 101, the gate valve is closed, and the interior of the vacuum chamber 101 is exhausted using the vacuum pump or the like of the exhaust system 121. Once the interior of the vacuum chamber 101 has reached a predetermined degree of vacuum, a predetermined processing gas for etching processing is introduced into the vacuum chamber 101 from the processing gas supply system 106 via the gas diffusion cavity 104 and the small holes 105, and the interior of the vacuum chamber 101 is maintained at a predetermined pressure, for example approximately 1 Pa to 100 Pa.

In this state, high-frequency electrical power at a predetermined frequency is supplied to the susceptor 102 from the high-frequency power source 108. Through the high-frequency electrical power being applied to the susceptor 102, a high-frequency electric field is formed in the processing space between the shower head 103 and the susceptor 102. Moreover, a predetermined magnetic field is formed by the magnetic field-forming mechanism 123 in the processing space. As a result, a predetermined plasma is generated from the processing gas supplied into the processing space, and hence a predetermined film on the wafer W is etched by this plasma.

At this time, the processing gas supplied onto the surface of the wafer W from the small holes 105 of the shower head 103 flows from a central portion of the surface of the wafer W toward a peripheral portion thereof, passes from the periphery of the wafer W through the gap 111c between the lower member 111a and the upper member 111b of the focus ring 111, and then flows downward and is thus exhausted. This flow of the processing gas is formed uniformly around the wafer W.

Here, if the focus ring did not have the gap 111c, then the processing gas supplied onto the surface of the wafer W would pass over the focus ring and flow out to the surroundings. The flow of the processing gas would thus stagnate at the peripheral portion of the wafer W, and hence the etching rate for the wafer W as a whole may drop, and moreover the etching rate at the peripheral portion of the wafer W may be different to the etching rate at the central portion of the wafer W. In contrast with this, in the present embodiment, compared with the case that there is no gap 111c, the flow of the processing gas at the peripheral portion of the wafer W can be made smooth, and hence the problems described above can be resolved, i.e. the etching rate for the wafer W as a whole can be improved, and the uniformity of the etching rate over the surface of the wafer W can be improved.

Moreover, in the above case that the processing gas passes over the focus ring and flows out to the surroundings (i.e. the case that there is no gap 111c), the height of an upper surface of the focus ring will drop as the focus ring is consumed, and hence the flow of the processing gas will gradually change in accordance with this. The residence time of the processing gas will thus change, and hence the state of the etching processing on the wafer W will change; it will thus become necessary to replace the focus ring at a time when the amount by which the focus ring has been consumed is still relatively low.

In contrast with this, in the present embodiment, the processing gas flows to the surroundings via the gap 111c, and hence the effect of changes in the height of the upper surface of the focus ring due to being consumed on the state of processing of the wafer W can be suppressed, and thus the maintenance timing, i.e. the time period until the focus ring is replaced, can be lengthened.

Furthermore, when such consumption has occurred, by replacing only the upper member 111b instead of the whole of the focus ring 111, the cost of the replacement part can be reduced, and hence the running cost can be reduced.

After the predetermined plasma etching processing has been carried out as described above, the supply of the high-frequency electrical power from the high-frequency power source 108 is stopped, thus stopping the etching processing, and then using a procedure opposite to that described earlier, the wafer W is conveyed out from the vacuum chamber 101.

Figure 14:
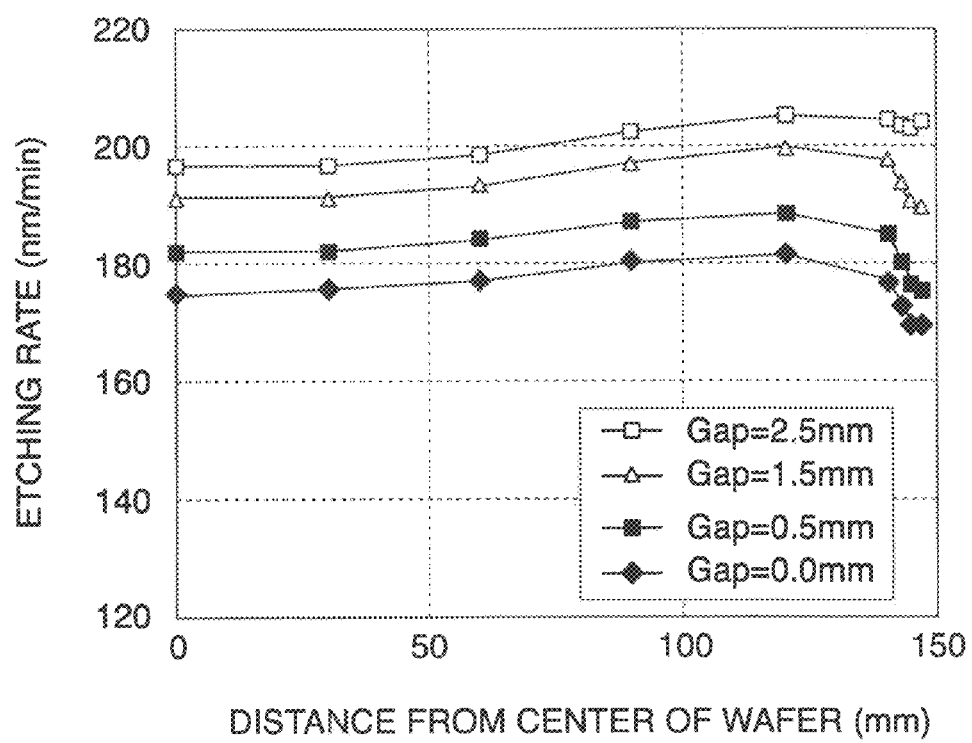
FIG. 14 is a graph showing changes in an etching state with changes in a focus ring gap width G.
Figure 15:
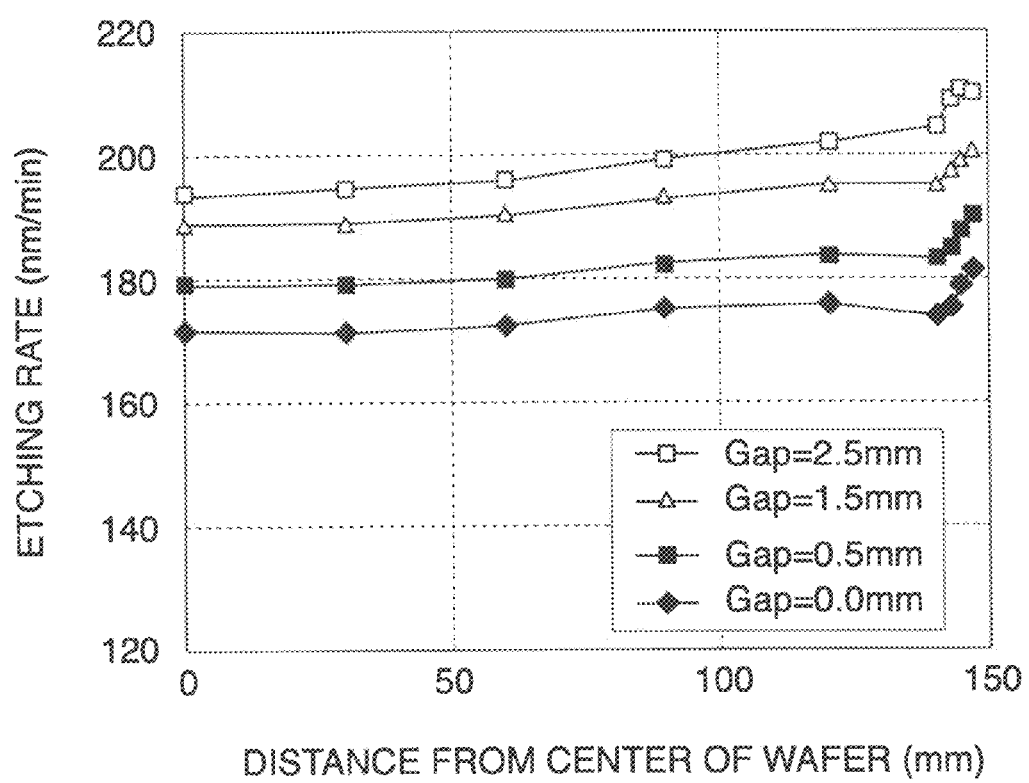
FIG. 15 is a graph showing changes in an etching state with changes in a focus ring gap width G.
Figure 16:
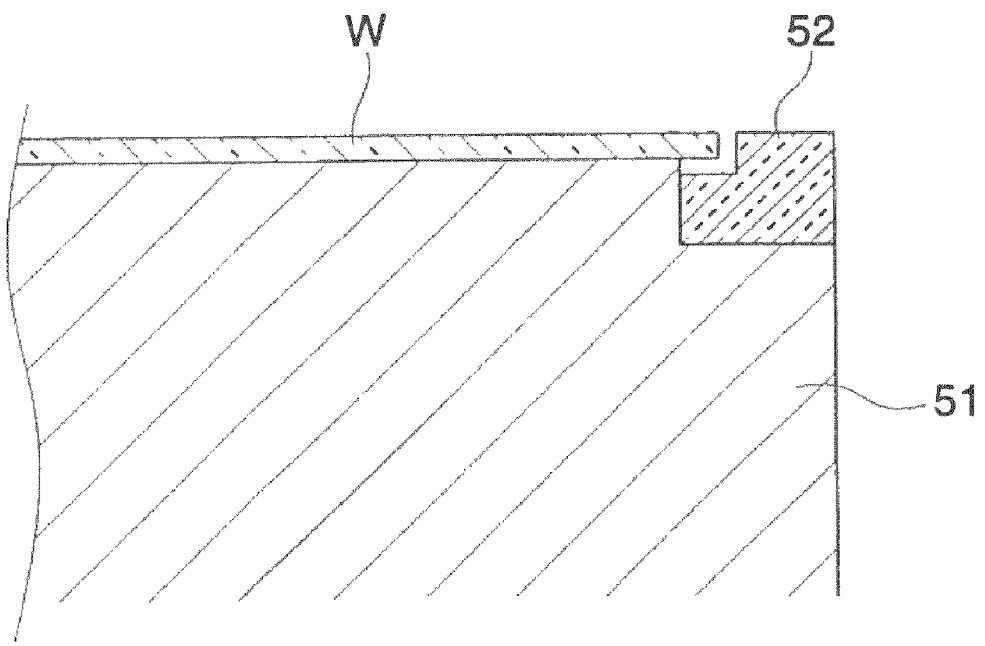
FIG. 16 is a schematic sectional view showing the construction of a conventional susceptor used in a plasma processing apparatus.
Figure 17:
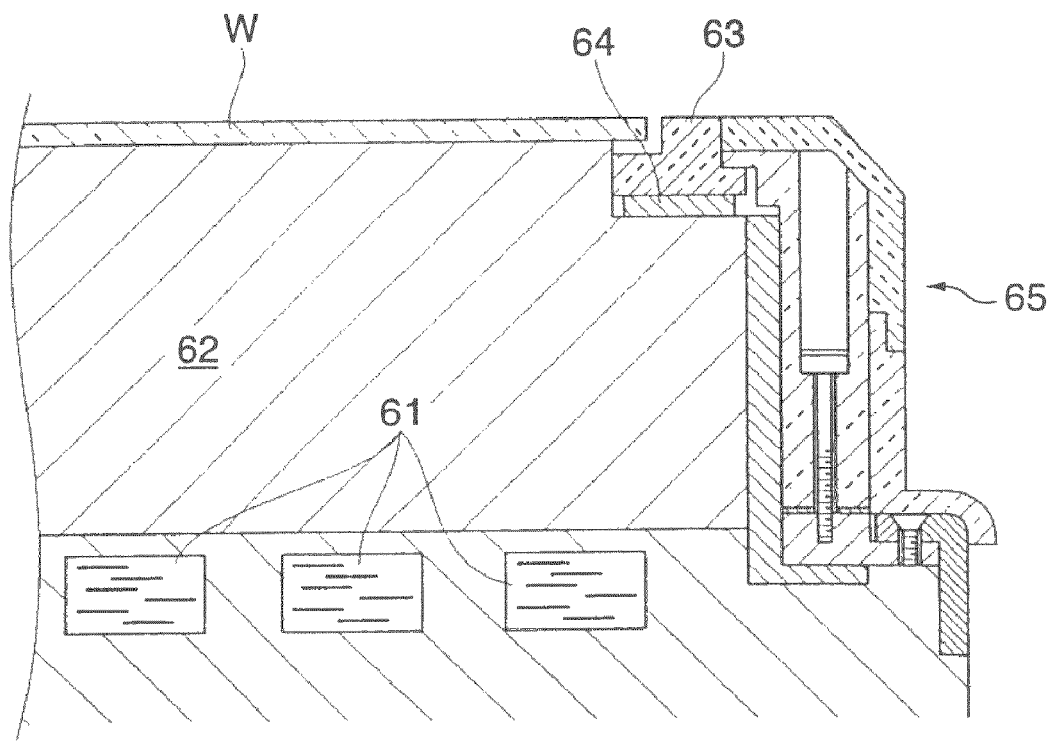
FIG. 17 is a schematic sectional view showing the construction of a conventional susceptor in which the heat transfer ability between a focus ring and an electrostatic chuck are improved.
Figure 18:
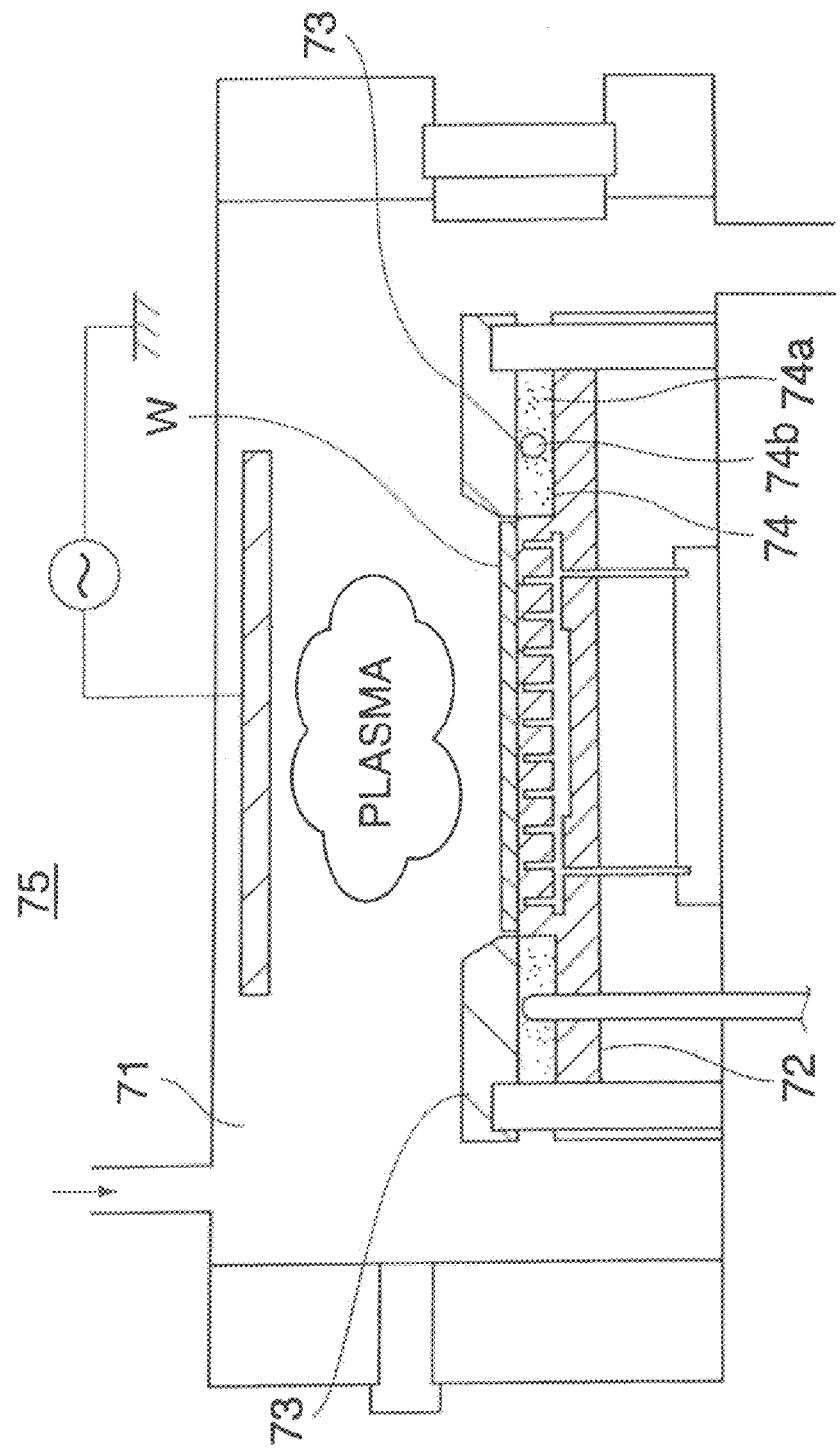
FIG. 18 is a schematic sectional view showing the construction of a conventional etching apparatus.

The graphs in FIGS. 14 and 15 show changes in the etching state at each portion of a wafer W with changes in the gap width G of the gap 111c in the focus ring 111; in FIGS. 14 and 15, the axis of ordinate shows the etching rate (nm/min), and the axis of abscissa shows the distance (mm) from the center of the wafer.

The film to be etched was an SiN film, the etching gas used was $CHF_3/CF_4/Ar/O_2$ at flow rates of 30, 75, 600 and 15 sccm respectively, and the etching was carried out under conditions of a pressure of 23.3 Pa (175 mTorr), and a high-frequency electrical power of 1000 W (frequency: 13.56 MHz). Moreover, FIG. 14 shows the case that the thickness of the upper member 111b of the focus ring 111 was 1.5 mm, and FIG. 15 shows the case that the thickness of the upper member 111b of the focus ring 111 was 2.8 mm. In both cases, the thickness of the lower member 111a of the focus ring 111 was 1.5 mm.

As shown by these graphs, compared with the case that the gap width G of the gap 111c is zero, as the gap width G is widened to 0.5 mm, 1.5 mm and then 2.5 mm, the etching rate for the wafer W as a whole increases.

Moreover, as shown clearly in the graph in FIG. 14 in particular, when the gap width G of the gap 111c is zero, the etching rate at the peripheral portion of the wafer W becomes lower than the etching rate at the central portion of the wafer W, but upon widening the gap width G of the gap 111c, the etching rate at the peripheral portion of the wafer W increases more than the etching rate at the central portion of the wafer W, and hence the uniformity of the etching rate over the surface of the wafer W can be improved.

Here, as mentioned above, FIG. 15 shows the case that the thickness of the upper member 111b is 2.8 mm, and FIG. 14 shows the case that the thickness of the upper member 111b is 1.5 mm; the results shown in FIG. 14 thus substantially show the results for the state that 1.3 mm of the upper member 111b has been consumed from the state shown in FIG. 15. As is clear from looking, for example, at the change in the etching state between FIGS. 15 and 14 for the case that the gap width G of the gap 111c is 2.5 mm, and this change for the case that the gap width G is zero, the effect of consumption of the focus ring on the uniformity of the etching processing over the surface of the wafer W can be reduced in the case that the gap width G is 2.5 mm compared with the case that the gap width G is zero. The maintenance frequency, i.e. the frequency of replacing the focus ring, can thus be reduced in the case that the gap width G is 2.5 mm compared with the case that the gap width G is zero.

If the gap width G is made to be narrower than 0.5 mm, then the operation of the gap 111c as a processing gas flow path is impaired due to a drop in the conductance, and hence the marked difference in terms of operating effects described above disappears. It is thus preferable to make the gap width G at least 0.5 mm.

As described above, according to the present embodiment, by using the focus ring 111, the etching rate for the wafer W as a whole can be increased, and hence the throughput can be increased, and thus the productivity can be improved.

Moreover, with etching processing in which the etching rate at a peripheral portion of the wafer W becomes lower than the etching rate at a central portion of the wafer W if the gap width G is zero, by using the focus ring 111 according to the present embodiment, and suitably adjusting the gap width G, the etching rate at the peripheral portion of the wafer W can be increased more than the etching rate at the central portion of the wafer W, and hence the uniformity of the etching rate over the surface of the wafer W can be improved, and thus high-precision etching processing can be carried out.

Furthermore, according to the present embodiment, the frequency of maintenance such as replacing the focus ring 111 can be reduced, and hence the uptime ratio for the apparatus can be improved, and thus the productivity can be improved; furthermore, when consumption of the focus ring 111 has occurred, by replacing only the upper member 111b, i.e. only part of the focus ring 111, the running cost can be reduced.

In the embodiments described above, the present invention is applied to the etching of semiconductor wafers; however, the present invention is not limited to this case, but rather can also be similarly applied in the case of carrying out etching on other substrates such as glass substrates for liquid crystal display apparatuses.

With the plasma processing apparatuses described above, the values of the focus ring cooling pressure and the focus ring chuck voltage may be set in advance in accordance with the thickness of the focus ring that will be consumed over time during one maintenance cycle. Moreover, the extent of consumption of the focus ring may be detected using detection means such as an optical sensor, and the detected values may be fed back into the set values of the focus ring cooling pressure and the focus ring chuck voltage, whereby the extent of consumption of the focus ring can be reflected in the processing recipe for the next time of carrying out processing.

Moreover, the present invention can be applied not only to etching apparatuses, but also to other plasma processing apparatuses such as CVD apparatuses and ashing apparatuses.

What is claimed is:

1. A control method for a plasma processing apparatus which includes:
    a susceptor having an electrostatic chuck on which is mounted an object to be processed that is to be subjected to plasma processing, and a focus ring having a contact surface disposed in contact with the electrostatic chuck around a periphery of the object to be processed, the focus ring being mounted on the electrostatic chuck, the electrostatic chuck having a chuck device to which a chuck voltage is applied, and the electrostatic chuck attracting the focus ring by electrostatic attraction generated by the chuck voltage applied to the chuck device;
    heat exchange means provided at the contact surface, for carrying out heat exchange with the focus ring, the heat exchange means comprising a groove exposed to the contact surface and filled with a heat transfer medium, the groove being formed in the electrostatic chuck, and the heat exchange means further comprising a supply path that supplies the heat transfer medium to the groove;
    a controller that controls the chuck voltage applied to the chuck device; and
    a chamber having the susceptor therein,
    the control method comprising the steps of:
    changing the chuck voltage in accordance with each of multiple sequences of a plasma process and setting the chuck voltage applied to the chuck device high during at least one processing sequence;
    controlling a pressure of the heat transfer medium supplied from the heat exchange means and changing the pressure of the heat transfer medium supplied in accordance with each of multiple steps of the plasma process; and
    setting the pressure of the heat transfer medium filled into the groove which is covered by the focus ring in contact with the electrostatic chuck to a non-zero level during conveying of the object to be processed into and out of the chamber so as to carry out cooling of the focus ring during conveying the object into and out of the chamber.

2. The control method for a plasma processing apparatus as claimed in claim 1, further comprising
    setting the pressure of the heat transfer medium filled into the groove during conveying of the object to be processed into and out of the chamber lower than that of the heat transfer medium filled into the groove during the plasma processing carried out on the object to be processed.

3. The control method for a plasma processing apparatus as claimed in claim 1, wherein the groove has a depth of not less than 0.1 mm.

4. The control method for a plasma processing apparatus as claimed in claim 1, wherein the groove has corners thereof rounded off.

5. The control method for a plasma processing apparatus as claimed in claim 1, wherein the groove comprises at least one groove having an annular shape concentric with the focus ring.

6. The control method for a plasma processing apparatus as claimed in claim 1, wherein the chuck device comprises an electrode built into the electrostatic chuck in a manner facing the focus ring.

7. The control method for a plasma processing apparatus as claimed in claim 1, wherein the heat exchange means reduces a temperature of the focus ring to at least 20° C. below a temperature of the electrostatic chuck.

8. The control method for a plasma processing apparatus as claimed in claim 1, wherein the heat exchange means reduces the temperature of the focus ring to not more than 0° C.

9. The control method for a plasma processing apparatus as claimed in claim 1, wherein the heat exchange means comprises heating means for heating the focus ring.

10. The control method for a plasma processing apparatus as claimed in claim 1, further comprising
    evacuating the supply path when reducing a pressure inside the chamber.

11. The control method for a plasma processing apparatus as claimed in claim 1, further comprising
    increasing the pressure of the heat transfer medium in accordance with incrementing of the chuck voltage during the process sequence.

12. The control method for a plasma processing apparatus as claimed in claim 1, wherein the plasma processing apparatus further comprises a heating member in contact with the focus ring and covering at least an outer peripheral surface of the focus ring.

13. The control method for a plasma processing apparatus as claimed in claim 1, further comprising
    controlling the chuck voltage to maintain a same polarity during the at least one processing sequence as during conveying the object from the chamber.

14. The control method for a plasma processing apparatus as claimed in claim 1, further comprising
    controlling the chuck voltage to a first non-zero level during processing and controlling the chuck voltage to a second non-zero level during conveying of the object into and out of the chamber.

* * * * *